US011817114B2

(12) United States Patent
Port et al.

(10) Patent No.: US 11,817,114 B2
(45) Date of Patent: Nov. 14, 2023

(54) CONTENT AND ENVIRONMENTALLY AWARE ENVIRONMENTAL NOISE COMPENSATION

(71) Applicant: Dolby Laboratories Licensing Corporation, San Francisco, CA (US)

(72) Inventors: Timothy Alan Port, Drummoyne (AU); Daniel Steven Templeton, San Francisco, CA (US); Jack Gregory Hays, South San Francisco, CA (US)

(73) Assignee: Dolby Laboratories Licensing Corporation, San Francisco, CA (US)

( * ) Notice: Subject to any disclaimer, the term of this patent is extended or adjusted under 35 U.S.C. 154(b) by 0 days.

(21) Appl. No.: 17/779,515

(22) PCT Filed: Dec. 9, 2019

(86) PCT No.: PCT/US2020/064135
§ 371 (c)(1),
(2) Date: May 24, 2022

(87) PCT Pub. No.: WO2021/119214
PCT Pub. Date: Jun. 17, 2021

(65) Prior Publication Data
US 2022/0406326 A1 Dec. 22, 2022

Related U.S. Application Data

(60) Provisional application No. 63/198,998, filed on Nov. 30, 2020, provisional application No. 63/198,995, (Continued)

(51) Int. Cl.
*G10L 21/0232* (2013.01)
*G06F 3/16* (2006.01)
(Continued)

(52) U.S. Cl.
CPC .......... *G10L 21/0232* (2013.01); *G06F 3/162* (2013.01); *G06F 3/165* (2013.01);
(Continued)

(58) Field of Classification Search
CPC ....... G10L 2021/02082; G10L 21/0208; G10L 15/22; G10L 2015/223; G10L 21/0232;
(Continued)

(56) References Cited

U.S. PATENT DOCUMENTS 4,629,829 A 12/1986 Puhl
5,907,622 A 5/1999 Dougherty
(Continued)

FOREIGN PATENT DOCUMENTS

EP 0993670 B1 3/2002
EP 1414021 B1 5/2008
(Continued)

OTHER PUBLICATIONS

Dalskov, D., Locating Acoustic Sources with Multilateration—Applied to Stationary and Moving Sources, (Aalborg University, Jun. 4, 2014).
(Continued)

*Primary Examiner* — Lun-See Lao

(57) ABSTRACT

Some implementations involve receiving a content stream that includes audio data, determining a content type corresponding to the content stream and determining, based at least in part on the content type, a noise compensation method. Some examples involve performing the noise compensation method on the audio data to produce noise-compensated audio data, rendering the noise-compensated audio data for reproduction via a set of audio reproduction transducers of the audio environment, to produce rendered
(Continued)

audio signals, and providing the rendered audio signals to at least some audio reproduction transducers of the audio environment.

22 Claims, 14 Drawing Sheets

Related U.S. Application Data filed on Nov. 30, 2020, provisional application No. 63/198,996, filed on Nov. 30, 2020, provisional application No. 63/198,997, filed on Nov. 30, 2020, provisional application No. 63/198,999, filed on Nov. 30, 2020, provisional application No. 62/945,607, filed on Dec. 9, 2019, provisional application No. 62/945,303, filed on Dec. 9, 2019, provisional application No. 62/945,292, filed on Dec. 9, 2019.

(51) Int. Cl.

| | | |
|---|---|---|
| G10L 15/22 | (2006.01) | |
| G10L 25/51 | (2013.01) | |
| H04R 1/08 | (2006.01) | |
| H04R 3/02 | (2006.01) | |
| H04R 3/04 | (2006.01) | |
| H04R 29/00 | (2006.01) | |
| H04R 1/40 | (2006.01) | |
| H04R 3/00 | (2006.01) | |
| H04R 3/12 | (2006.01) | |
| H03G 3/32 | (2006.01) | |
| H03G 9/02 | (2006.01) | |
| H04M 9/08 | (2006.01) | |

(52) U.S. Cl.
CPC .............. *G10L 15/22* (2013.01); *G10L 25/51* (2013.01); *H03G 3/32* (2013.01); *H03G 9/025* (2013.01); *H04M 9/082* (2013.01); *H04R 1/08* (2013.01); *H04R 1/403* (2013.01); *H04R 1/406* (2013.01); *H04R 3/005* (2013.01); *H04R 3/02* (2013.01); *H04R 3/04* (2013.01); *H04R 3/12* (2013.01); *H04R 29/001* (2013.01); *H04R 29/002* (2013.01); *G10L 2015/223* (2013.01); *H04R 2420/07* (2013.01); *H04R 2430/01* (2013.01)

(58) Field of Classification Search
CPC ..... G10L 25/51; G10L 19/167; G10L 21/034; G10L 21/0364; G10L 25/48; G10L 25/57; G10L 25/60; G10L 25/81; G10L 21/02; G10L 21/0216; H04M 9/082; H04R 1/1083; H04R 2227/001; H04R 2430/01; H04R 2430/03; H04R 3/007; H04R 3/02; H04R 3/04; H04R 1/08; H04R 1/403; H04R 1/406; H04R 2420/07; H04R 29/001; H04R 29/002; H04R 3/005; H04R 3/12; H04R 5/04; H04R 2227/005; H04N 21/4394; H04N 21/233; H04N 21/4398; H04N 21/4532; H04N 21/4884; H04N 5/278; H04N 21/21815; H04N 21/23418; H04N 21/23424; H04N 21/23476; H04N 21/2662; H04N 21/4126; H04N 21/4334; H04N 21/439; H04N 21/44008; H04N 21/44016; H04N 21/4524; H04N 21/47202; H04N 21/631; H04N 21/6373; H04N 21/8106; H04N 21/812; H04N 21/84; H04N 21/8456; H04N 7/1675; H04N 7/17318; H04L 65/80; H04L 65/612; H04L 65/752; H04L 65/762; H04L 65/764; H04L 67/5681; H04W 24/02; H04W 4/029; H04S 7/30; H04S 7/301; H04S 2400/13; H04S 7/302; H04S 7/305; H04S 2400/00
USPC ........................................................ 381/56–58
See application file for complete search history.

(56) References Cited

U.S. PATENT DOCUMENTS

| | | | |
|---|---|---|---|
| 6,674,865 B1* | 1/2004 | Venkatesh | H04R 3/02 |
| | | | 381/86 |
| 6,708,145 B1 | 3/2004 | Gustaf | |
| 7,333,618 B2 | 2/2008 | Shuttleworth | |
| 7,519,189 B2 | 4/2009 | Bongiovi | |
| 7,760,893 B1 | 7/2010 | Felber | |
| 7,889,943 B1 | 2/2011 | Christian | |
| 8,005,231 B2* | 8/2011 | Shuttleworth | H03G 3/32 |
| | | | 381/57 |
| 8,090,120 B2 | 1/2012 | Seefeldt | |
| 8,112,166 B2 | 2/2012 | Pavlovic | |
| 8,244,196 B2 | 8/2012 | Yang | |
| 8,285,344 B2 | 10/2012 | Kahn | |
| 8,447,045 B1 | 5/2013 | Laroche | |
| 8,565,442 B2 | 10/2013 | Maeda | |
| 8,660,281 B2 | 2/2014 | Bouchard | |
| 8,797,465 B2 | 8/2014 | Hardacker | |
| 9,076,456 B1 | 7/2015 | Avendano | |
| 9,159,335 B2 | 10/2015 | Kim | |
| 9,183,845 B1 | 11/2015 | Gopalakrishnan | |
| 9,240,176 B2 | 1/2016 | Tzirkel-Hancock | |
| 9,368,099 B2 | 6/2016 | Alderson | |
| 9,426,598 B2 | 8/2016 | Walsh | |
| 9,609,141 B2 | 3/2017 | Beaucoup | |
| 9,648,436 B2 | 5/2017 | Kraft | |
| 9,699,556 B2 | 7/2017 | Aggarwal | |
| 9,729,969 B2 | 8/2017 | Risberg | |
| 9,792,892 B2 | 10/2017 | Gul | |
| 9,842,605 B2 | 12/2017 | Lu | |
| 10,242,689 B2 | 3/2019 | Chatlani | |
| 10,389,321 B2 | 8/2019 | Seefeldt | |
| 11,232,807 B2 | 1/2022 | Hines | |
| 11,587,576 B2* | 2/2023 | Hines | H04R 1/08 |
| 2005/0260985 A1 | 11/2005 | Rader | |
| 2007/0242837 A1 | 10/2007 | Glen | |
| 2008/0269926 A1 | 10/2008 | Xiang | |
| 2010/0166225 A1 | 7/2010 | Watanabe | |
| 2010/0172510 A1 | 7/2010 | Juvonen | |
| 2011/0200200 A1* | 8/2011 | Avayu | G10L 21/0208 |
| | | | 381/58 |
| 2011/0251704 A1 | 10/2011 | Walsh | |
| 2012/0230501 A1 | 9/2012 | Ganter | |
| 2012/0328114 A1 | 12/2012 | Takeuchi | |
| 2013/0054251 A1 | 2/2013 | Eppolito | |
| 2013/0315405 A1 | 11/2013 | Kanishima | |
| 2014/0337016 A1 | 11/2014 | Herbig | |
| 2015/0003625 A1* | 1/2015 | Uhle | G10K 11/17857 |
| | | | 381/71.6 |
| 2015/0154977 A1 | 6/2015 | Ekman | |
| 2015/0205571 A1 | 7/2015 | Duwenhorst | |
| 2017/0245083 A1 | 8/2017 | Kordon | |
| 2019/0066672 A1 | 2/2019 | Wood | |
| 2019/0082140 A1 | 3/2019 | Einarsson | |
| 2019/0199309 A1 | 6/2019 | Seefeldt | |
| 2019/0304431 A1 | 10/2019 | Cardinaux | |
| 2019/0371357 A1* | 12/2019 | Ramaswamy | H04N 21/42203 |
| 2019/0372541 A1 | 12/2019 | Friant | |
| 2020/0092646 A1 | 3/2020 | Yamamoto | |
| 2021/0265966 A1 | 8/2021 | Port | |
| 2021/0273623 A1 | 9/2021 | Port | |
| 2022/0174368 A1* | 6/2022 | Marten | H04N 21/84 |

FOREIGN PATENT DOCUMENTS

| | | | |
|---|---|---|---|
| EP | 1978649 | A2 | 10/2008 |
| EP | 3226412 | B1 | 10/2021 |

(56) References Cited

FOREIGN PATENT DOCUMENTS

| WO | 2018211908 A1 | 11/2018 |
| WO | 2019209973 A1 | 10/2019 |
| WO | 2021034625 A1 | 2/2021 |

OTHER PUBLICATIONS

ISO/IEC 23003-4:2015 (MPEG-D Part 4: Dynamic Range Control) standard.

Lianga, R. et al "An Improved Method to Enhance High-Frequency Speech Intelligibility in Noise" Applied Acoustics, vol. 74, Issue 1, Jan. 2013.

Park, J.S. "Acoustic Interference cancellation for a Voice-Driven Interface in Smart TVs" IEEE vol. 59, Issue 1, Feb. 2013, pp. 244-249.

Shrawankar, U. et al "Acoustic Echo Cancellation Postfilter Design Issues For Speech Recognition System" International Journal of Science and Advanced Technology, vol. 1, No. 5, Jul. 2011, pp. 38-43.

* cited by examiner

CONTENT AND ENVIRONMENTALLY AWARE ENVIRONMENTAL NOISE COMPENSATION

CROSS-REFERENCE TO RELATED APPLICATIONS

This application claims the benefit of:
U.S. Provisional Patent Application No. 62/945,292, filed 9 Dec. 2019;
U.S. Provisional Patent Application No. 62/945,303, filed 9 Dec. 2019;
U.S. Provisional Patent Application No. 62/945,607 filed 9 Dec. 2019;
U.S. Provisional Patent Application No. 63/198,995 filed 30 Nov. 2020;
U.S. Provisional Patent Application No. 63/198,996 filed 30 Nov. 2020;
U.S. Provisional Patent Application No. 63/198,997 filed 30 Nov. 2020;
U.S. Provisional Patent Application No. 63/198,998 filed 30 Nov. 2020; and
U.S. Provisional Patent Application No. 63/198,999 filed 30 Nov. 2020, which are incorporated herein by reference.

TECHNICAL FIELD

This disclosure pertains to systems and methods for noise compensation.

BACKGROUND

Audio and video devices, including but not limited to televisions and associated audio devices, are widely deployed. Although existing systems and methods for controlling audio and video devices provide benefits, improved systems and methods would be desirable.

Notation and Nomenclature

Throughout this disclosure, including in the claims, the terms "speaker," "loudspeaker" and "audio reproduction transducer" are used synonymously to denote any sound-emitting transducer (or set of transducers) driven by a single speaker feed. A typical set of headphones includes two speakers. A speaker may be implemented to include multiple transducers (e.g., a woofer and a tweeter), which may be driven by a single, common speaker feed or multiple speaker feeds. In some examples, the speaker feed(s) may undergo different processing in different circuitry branches coupled to the different transducers.

Throughout this disclosure, including in the claims, the expression performing an operation "on" a signal or data (e.g., filtering, scaling, transforming, or applying gain to, the signal or data) is used in a broad sense to denote performing the operation directly on the signal or data, or on a processed version of the signal or data (e.g., on a version of the signal that has undergone preliminary filtering or pre-processing prior to performance of the operation thereon).

Throughout this disclosure including in the claims, the expression "system" is used in a broad sense to denote a device, system, or subsystem. For example, a subsystem that implements a decoder may be referred to as a decoder system, and a system including such a subsystem (e.g., a system that generates X output signals in response to multiple inputs, in which the subsystem generates M of the inputs and the other X-M inputs are received from an external source) may also be referred to as a decoder system.

Throughout this disclosure including in the claims, the term "processor" is used in a broad sense to denote a system or device programmable or otherwise configurable (e.g., with software or firmware) to perform operations on data (e.g., audio, or video or other image data). Examples of processors include a field-programmable gate array (or other configurable integrated circuit or chip set), a digital signal processor programmed and/or otherwise configured to perform pipelined processing on audio or other sound data, a programmable general purpose processor or computer, and a programmable microprocessor chip or chip set.

Throughout this disclosure including in the claims, the term "couples" or "coupled" is used to mean either a direct or indirect connection. Thus, if a first device couples to a second device, that connection may be through a direct connection, or through an indirect connection via other devices and connections.

As used herein, a "smart device" is an electronic device, generally configured for communication with one or more other devices (or networks) via various wireless protocols such as Bluetooth, Zigbee, near-field communication, Wi-Fi, light fidelity (Li-Fi), 3G, 4G, 5G, etc., that can operate to some extent interactively and/or autonomously. Several notable types of smart devices are smartphones, smart cars, smart thermostats, smart doorbells, smart locks, smart refrigerators, phablets and tablets, smartwatches, smart bands, smart key chains and smart audio devices. The term "smart device" may also refer to a device that exhibits some properties of ubiquitous computing, such as artificial intelligence.

Herein, we use the expression "smart audio device" to denote a smart device which is either a single-purpose audio device or a multi-purpose audio device (e.g., an audio device that implements at least some aspects of virtual assistant functionality). A single-purpose audio device is a device (e.g., a television (TV)) including or coupled to at least one microphone (and optionally also including or coupled to at least one speaker and/or at least one camera), and which is designed largely or primarily to achieve a single purpose. For example, although a TV typically can play (and is thought of as being capable of playing) audio from program material, in most instances a modern TV runs some operating system on which applications run locally, including the application of watching television. In this sense, a single-purpose audio device having speaker(s) and microphone(s) is often configured to run a local application and/or service to use the speaker(s) and microphone(s) directly. Some single-purpose audio devices may be configured to group together to achieve playing of audio over a zone or user configured area.

One common type of multi-purpose audio device is an audio device that implements at least some aspects of virtual assistant functionality, although other aspects of virtual assistant functionality may be implemented by one or more other devices, such as one or more servers with which the multi-purpose audio device is configured for communication. Such a multi-purpose audio device may be referred to herein as a "virtual assistant." A virtual assistant is a device (e.g., a smart speaker or voice assistant integrated device) including or coupled to at least one microphone (and optionally also including or coupled to at least one speaker and/or at least one camera). In some examples, a virtual assistant may provide an ability to utilize multiple devices (distinct from the virtual assistant) for applications that are in a sense cloud-enabled or otherwise not completely implemented in or on the virtual assistant itself. In other words, at least some aspects of virtual assistant functionality, e.g., speech recognition functionality, may be implemented (at least in part) by one or more servers or other devices with which a virtual assistant may communication via a network, such as the Internet. Virtual assistants may sometimes work together, e.g., in a discrete and conditionally defined way. For example, two or more virtual assistants may work together in the sense that one of them, e.g., the one which is most confident that it has heard a wakeword, responds to the wakeword. The connected virtual assistants may, in some implementations, form a sort of constellation, which may be managed by one main application which may be (or implement) a virtual assistant.

Herein, "wakeword" is used in a broad sense to denote any sound (e.g., a word uttered by a human, or some other sound), where a smart audio device is configured to awake in response to detection of ("hearing") the sound (using at least one microphone included in or coupled to the smart audio device, or at least one other microphone). In this context, to "awake" denotes that the device enters a state in which it awaits (in other words, is listening for) a sound command. In some instances, what may be referred to herein as a "wakeword" may include more than one word, e.g., a phrase.

Herein, the expression "wakeword detector" denotes a device configured (or software that includes instructions for configuring a device) to search continuously for alignment between real-time sound (e.g., speech) features and a trained model. Typically, a wakeword event is triggered whenever it is determined by a wakeword detector that the probability that a wakeword has been detected exceeds a predefined threshold. For example, the threshold may be a predetermined threshold which is tuned to give a reasonable compromise between rates of false acceptance and false rejection. Following a wakeword event, a device might enter a state (which may be referred to as an "awakened" state or a state of "attentiveness") in which it listens for a command and passes on a received command to a larger, more computationally-intensive recognizer.

As used herein, the terms "program stream" and "content stream" refer to a collection of one or more audio signals, and in some instances video signals, at least portions of which are meant to be heard together. Examples include a selection of music, a movie soundtrack, a movie, a television program, the audio portion of a television program, a podcast, a live voice call, a synthesized voice response from a smart assistant, etc. In some instances, the content stream may include multiple versions of at least a portion of the audio signals, e.g., the same dialogue in more than one language. In such instances, only one version of the audio data or portion thereof (e.g., a version corresponding to a single language) is intended to be reproduced at one time.

SUMMARY

At least some aspects of the present disclosure may be implemented via one or more audio processing methods, including but not limited to content stream processing methods. In some instances, the method(s) may be implemented, at least in part, by a control system and/or via instructions (e.g., software) stored on one or more non-transitory media. Some such methods involve receiving, by a control system and via an interface system, a content stream that includes audio data and determining, by the control system, a content type corresponding to the content stream. Some such methods involve determining, by the control system and based at least in part on the content type, a noise compensation method. Some such methods involve determining, by the control system, a noise estimate for an audio environment in which the content stream will be reproduced and performing, by the control system and based at least in part on the noise estimate, the noise compensation method on the audio data to produce noise-compensated audio data. Some such methods involve rendering, by the control system, the noise-compensated audio data for reproduction via a set of audio reproduction transducers of the audio environment, to produce rendered audio signals and providing, via the interface system, the rendered audio signals to at least some audio reproduction transducers of the set of audio reproduction transducers of the audio environment.

In some examples, determining the noise compensation method may be based, at least in part, on a dynamic range of at least one audio reproduction transducer of the audio environment. According to some examples, determining the noise compensation method may involve selecting the noise compensation method from a plurality of noise compensation methods. Each of the noise compensation methods may correspond to one or more content types of a plurality of content types. According to some examples, the plurality of content types may include at least one of a movie content type or a television program content type. In some examples, the plurality of content types may include at least one music content type.

In some examples, a noise compensation method corresponding to the at least one music content type may involve a first method corresponding to a lower frequency range and a second method corresponding to an upper frequency range. According to some examples, the first method may involve allowing a first gain applied to a first frequency band in the lower frequency range to be independent of a second gain applied to a second frequency band in the lower frequency range. In some instances, the second method may involve constraining all gains applied in frequency bands of the upper frequency range to be equal. However, in other examples the second method may involve constraining a difference between a first gain and a second gain to be less than or equal to a threshold amount. The first gain may be applied in a first frequency band of the upper frequency range and the second gain may be applied in a second frequency band of the upper frequency range. According to some examples, the first frequency band may be adjacent to the second frequency band.

According to some examples, determining the content type may be based, at least in part, on determining a content provider for the content stream. In some examples, determining the content type may be based, at least in part, on user input regarding the content stream. In some such examples, the user input may be received via a voice command to a virtual assistant. In some examples, determining the content type may be based, at least in part, on determining an application that implements decoding of the content stream.

In some examples, the content stream may include content metadata. According to some examples, determining the content type may be based, at least in part, on the content metadata.

According to some examples, the control system may be configured to implement an audio classifier. In some examples, determining the content type may be based, at least in part, on an audio classification produced by the audio classifier.

In some implementations, determining the noise estimate may involve receiving the noise estimate from a noise estimation module and/or calculating the noise estimate based on microphone signals of one or more microphones in the audio environment. In some instances, the noise estimate may indicate an estimated noise level for each of a plurality of frequency bands.

In some examples, determining the noise compensation method may be based, at least in part, on a time of day. According to some examples, a nighttime noise compensation method may involve controlling playback levels of at least some frequency bands of reproduced audio data to be lower than playback levels of corresponding frequency bands of reproduced audio data corresponding to a daytime noise compensation method. The at least some frequency bands may, for example, correspond to bass frequency bands.

According to some examples, determining the noise compensation method may be based, at least in part, on a type of ambient noise in the audio environment. In some examples, the type of ambient noise may correspond to conversation. The noise compensation method may, in some such examples, involve controlling a playback level of reproduced audio data to be lower than the ambient noise level.

In some implementations, at least one noise compensation method may include a demonstration version and a default or "regular" version. The demonstration version may, for example, involve applying higher gains than the regular version in one or more frequency bands.

Some implementations may involve receiving metadata with the content stream. According to some examples, determining the noise compensation method may be based, at least in part, on the metadata. In some instances, the metadata may correspond to a dynamic range and/or a reference level of the audio data. According to some examples, the metadata may be "dialnorm" metadata of Dolby Digital, Dolby Digital Plus or AC-4 audio technology. According to some examples, the metadata may be reference level metadata of the High-Efficiency Advanced Audio Coding audio coding format.

Some or all of the operations, functions and/or methods described herein may be performed by one or more devices according to instructions (e.g., software) stored on one or more non-transitory media. Such non-transitory media may include memory devices such as those described herein, including but not limited to random access memory (RAM) devices, read-only memory (ROM) devices, etc. Accordingly, some innovative aspects of the subject matter described in this disclosure can be implemented via one or more non-transitory media having software stored thereon.

At least some aspects of the present disclosure may be implemented via apparatus. For example, one or more devices may be capable of performing, at least in part, the methods disclosed herein. In some implementations, an apparatus is, or includes, an audio processing system having an interface system and a control system. The control system may include one or more general purpose single- or multi-chip processors, digital signal processors (DSPs), application specific integrated circuits (ASICs), field programmable gate arrays (FPGAs) or other programmable logic devices, discrete gates or transistor logic, discrete hardware components, or combinations thereof.

Details of one or more implementations of the subject matter described in this specification are set forth in the accompanying drawings and the description below. Other features, aspects, and advantages will become apparent from the description, the drawings, and the claims. Note that the relative dimensions of the following figures may not be drawn to scale.

BRIEF DESCRIPTION OF THE DRAWINGS

Like reference numbers and designations in the various drawings indicate like elements.

DETAILED DESCRIPTION OF EMBODIMENTS

Figure 1:
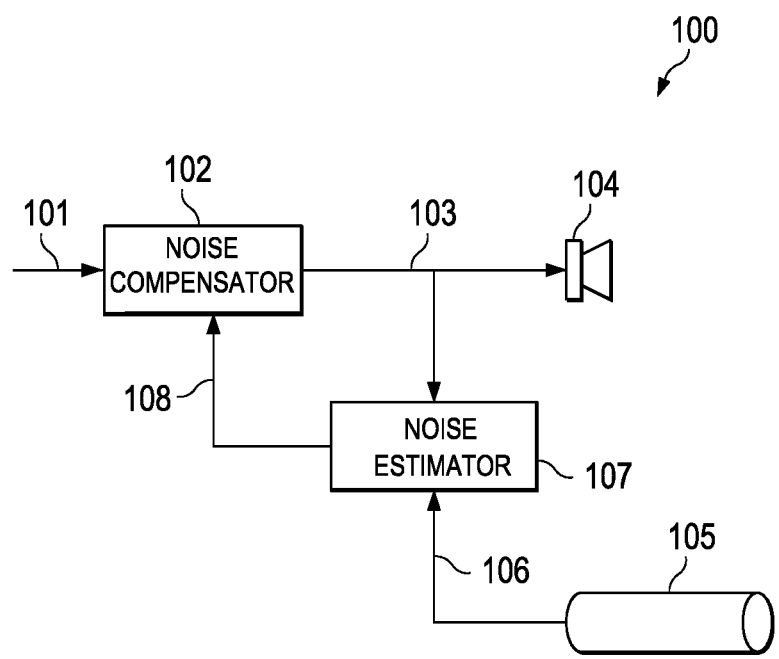
FIG. 1 shows an example of a noise compensation system.

Noise compensation systems are configured to compensate for environmental noise, e.g., ambient noise, within an audio environment. As used herein, the terms "ambient noise" and "environmental noise" refer to noise produced by one or more noise sources that are external to an audio playback system and/or a noise compensation system. The audio environment may, in some examples, be a home audio environment, e.g., one or more rooms of a home. In other examples, the audio environment may be another type of environment, such as an office environment, an automobile environment, a train environment, a street or sidewalk environment, a park environment, etc. FIG. 1 shows an example of a noise compensation system. In this example, the noise compensation system 100 is configured to adjust the level of the input audio signal 101 based upon a noise estimate 108. According to this example, the noise compensation system 100 includes a loudspeaker 104, a microphone 105, a noise estimator 107 and a noise compensator 102. In some examples, the noise estimator 107 and the noise compensator 102 may be implemented via a control system, e.g., according to instructions stored on one or more non-transitory storage media. As noted above, the terms "speaker," "loudspeaker" and "audio reproduction transducer" are used synonymously herein. As with other figures provided herein, the types and numbers of elements shown in FIG. 1 are merely provided by way of example. Other implementations may include more, fewer and/or different types and numbers of elements, e.g., more loudspeakers.

In this example, the noise compensator 102 is configured to receive an audio signal 101 from a file, a streaming service, etc. The noise compensator 102 may, for example, be configured to apply a gain adjustment algorithm, such as a frequency-dependent gain adjustment algorithm or a broadband gain adjustment algorithm.

In this example, the noise compensator 102 is configured to send a noise-compensated output signal 103 to the loudspeaker 104. According to this example, the noise-compensated output signal 103 is also provided to, and is a reference signal for, the noise estimator 107. In this example, microphone signals 106 are also sent to the noise estimator 107 from the microphone 105.

According to this example, the noise estimator 107 is a component that is configured to estimate the level of noise in an environment that includes the system 100. The noise estimator 107 may be configured to receive the microphone signals 106 and to calculate how much of the microphone signals 106 consist of noise and how much is due to the playback of the loudspeaker 104. The noise estimator 107 may, in some examples, include an echo canceller. However, in some implementations the noise estimator 107 may simply measure the noise when a signal corresponding with silence is sent to the loudspeaker 104. In this example, the noise estimator 107 is providing a noise estimate 108 to the noise compensator 102. The noise estimate 108 may be a broadband estimate or a spectral estimate of the noise, depending on the particular implementation. In this example, the noise compensator 102 is configured to adjust the level of the output of the loudspeaker 104 based upon the noise estimate 108.

The loudspeakers of some devices, such as mobile devices, often have rather limited capabilities. Accordingly, the type of volume adjustment provided by the system 100 will be generally limited by the dynamic range and/or the speaker protection components (e.g., limiters and/or compressors) of such loudspeakers.

Noise compensation systems such as the noise compensation system 100 may apply gains that are either frequency-dependent gains or broadband gains. Some such noise compensation systems are configured to apply frequency-dependent gains based on a single model that boosts the gains in the frequency bands in which environmental noise is present. This approach can work well for movie content, e.g., when the noise compensation system 100 is attempting to improve the intelligibility of dialog above environmental noise. However, when such a noise compensation system is attempting to compensate for environmental noise when music is being reproduced in the environment, this type of noise compensation can cause a noticeable timbral shift that some listeners may not like. Some listeners have described the effect of this type of noise compensation as causing the music to sound "tinny."

The present disclosure provides various methods that can overcome at least some of these potential drawbacks, as well as devices and systems for implementing the presently-disclosed methods. Some disclosed implementations involve determining a noise compensation method that is based at least in part on the type of content that is being reproduced. In some such examples, a noise compensation method for a movie content type and/or a television program content type may be different from a noise compensation method for a music content type. However, other implementations do not involve determining a noise compensation method based at on the content type. According to some implementations, the noise compensation method may be determined (at least in part) by one or more local devices of an audio environment. Alternatively, or additionally, the noise compensation method may be determined (at least in part) by one or more remote devices, such as one or more devices implementing a cloud-based service. In some disclosed implementations, the noise compensation method may be based, at least in part, on a dynamic range of one or more audio reproduction transducers of the audio environment and/or on a dynamic range of the audio data that is being reproduced.

Figure 2:
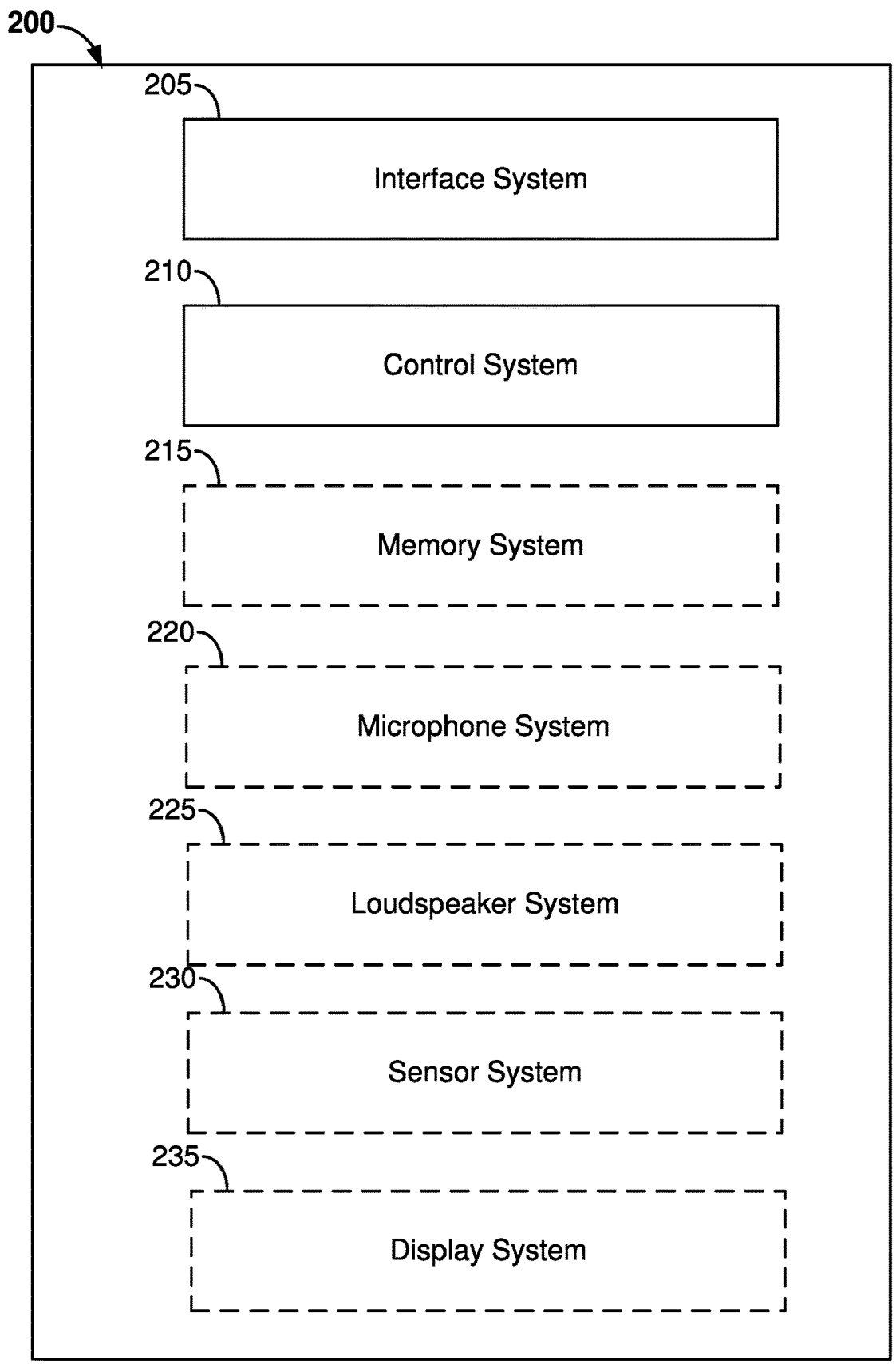
FIG. 2 is a block diagram that shows examples of components of an apparatus capable of implementing various aspects of this disclosure.

FIG. 2 is a block diagram that shows examples of components of an apparatus capable of implementing various aspects of this disclosure. As with other figures provided herein, the types and numbers of elements shown in FIG. 2 are merely provided by way of example. Other implementations may include more, fewer and/or different types and numbers of elements. According to some examples, the apparatus 200 may be configured for performing at least some of the methods disclosed herein. In some implementations, the apparatus 200 may be, or may include, a television, one or more components of an audio system, a mobile device (such as a cellular telephone), a laptop computer, a tablet device, a smart speaker, or another type of device. In some implementations, the apparatus 200 may be, or may include, a television control module. The television control module may or may not be integrated into a television, depending on the particular implementation. In some implementations, the television control module may be a separate device from a television and may, in some instances, either be sold separately from a television or as an add-on or optional device that may be included with a purchased television. In some implementations, the television control module may be obtainable from a content provider, such as a provider of television programs, movies, etc.

According to some alternative implementations the apparatus 200 may be, or may include, a server. In some such examples, the apparatus 200 may be, or may include, an encoder. Accordingly, in some instances the apparatus 200 may be a device that is configured for use within an audio environment, such as a home audio environment, whereas in other instances the apparatus 200 may be a device that is configured for use in "the cloud," e.g., a server.

In this example, the apparatus 200 includes an interface system 205 and a control system 210. The interface system 205 may, in some implementations, be configured for communication with one or more other devices of an audio environment. The audio environment may, in some examples, be a home audio environment. In other examples, the audio environment may be another type of environment, such as an office environment, an automobile environment, a train environment, a street or sidewalk environment, a park environment, etc. The interface system 205 may, in some implementations, be configured for exchanging control information and associated data with audio devices of the audio environment. The control information and associated data may, in some examples, pertain to one or more software applications that the apparatus 200 is executing.

The interface system 205 may, in some implementations, be configured for receiving, or for providing, a content stream. The content stream may include audio data. The audio data may include, but may not be limited to, audio signals. In some instances, the audio data may include spatial data, such as channel data and/or spatial metadata. According to some implementations, the content stream may include metadata regarding a dynamic range of the audio data and/or metadata regarding one or more noise compensation methods. Metadata regarding a dynamic range of the audio data and/or metadata regarding one or more noise compensation methods may, for example, have been provided by one or more devices configured to implement a cloud-based service, such as one or more servers. Metadata regarding a dynamic range of the audio data and/or metadata regarding one or more noise compensation methods may, for example, have been provided by what may be referred to herein as an "encoder." In some such examples, in some examples, the content stream may include video data and audio data corresponding to the video data. Some examples of encoder and decoder operations are described below.

The interface system 205 may include one or more network interfaces and/or one or more external device interfaces (such as one or more universal serial bus (USB) interfaces). According to some implementations, the interface system 205 may include one or more wireless interfaces. The interface system 205 may include one or more devices for implementing a user interface, such as one or more microphones, one or more speakers, a display system, a touch sensor system and/or a gesture sensor system. In some examples, the interface system 205 may include one or more interfaces between the control system 210 and a memory system, such as the optional memory system 215 shown in FIG. 2. However, the control system 210 may include a memory system in some instances. The interface system 205 may, in some implementations, be configured for receiving input from one or more microphones in an environment.

The control system 210 may, for example, include a general purpose single- or multi-chip processor, a digital signal processor (DSP), an application specific integrated circuit (ASIC), a field programmable gate array (FPGA) or other programmable logic device, discrete gate or transistor logic, and/or discrete hardware components.

In some implementations, the control system 210 may reside in more than one device. For example, in some implementations a portion of the control system 210 may reside in a device within one of the environments depicted herein and another portion of the control system 210 may reside in a device that is outside the environment, such as a server, a mobile device (e.g., a smartphone or a tablet computer), etc. In other examples, a portion of the control system 210 may reside in a device within one of the environments depicted herein and another portion of the control system 210 may reside in one or more other devices of the environment. For example, control system functionality may be distributed across multiple smart audio devices of an environment, or may be shared by an orchestrating device (such as what may be referred to herein as a smart home hub) and one or more other devices of the environment. In other examples, a portion of the control system 210 may reside in a device that is implementing a cloud-based service, such as a server, and another portion of the control system 210 may reside in another device that is implementing the cloud-based service, such as another server, a memory device, etc. The interface system 205 also may, in some examples, reside in more than one device.

In some implementations, the control system 210 may be configured for performing, at least in part, the methods disclosed herein. According to some examples, the control system 210 may be configured for implementing methods of content stream processing.

Some or all of the methods described herein may be performed by one or more devices according to instructions (e.g., software) stored on one or more non-transitory media. Such non-transitory media may include memory devices such as those described herein, including but not limited to random access memory (RAM) devices, read-only memory (ROM) devices, etc. The one or more non-transitory media may, for example, reside in the optional memory system 215 shown in FIG. 2 and/or in the control system 210. Accordingly, various innovative aspects of the subject matter described in this disclosure can be implemented in one or more non-transitory media having software stored thereon. The software may, for example, include instructions for controlling at least one device to process a content stream, to encode a content stream, to decode a content stream, etc. The software may, for example, be executable by one or more components of a control system such as the control system 210 of FIG. 2.

In some examples, the apparatus 200 may include the optional microphone system 220 shown in FIG. 2. The optional microphone system 220 may include one or more microphones. In some implementations, one or more of the microphones may be part of, or associated with, another device, such as a speaker of the speaker system, a smart audio device, etc. In some examples, the apparatus 200 may not include a microphone system 220. However, in some such implementations the apparatus 200 may nonetheless be configured to receive microphone data for one or more microphones in an audio environment via the interface system 210. In some such implementations, a cloud-based implementation of the apparatus 200 may be configured to receive microphone data, or a noise metric corresponding at least in part to the microphone data, from one or more microphones in an audio environment via the interface system 210.

According to some implementations, the apparatus 200 may include the optional loudspeaker system 225 shown in FIG. 2. The optional loudspeaker system 225 may include one or more loudspeakers, which also may be referred to herein as "speakers" or, more generally, as "audio reproduction transducers." In some examples (e.g., cloud-based implementations), the apparatus 200 may not include a loudspeaker system 225.

In some implementations, the apparatus 200 may include the optional sensor system 230 shown in FIG. 2. The optional sensor system 230 may include one or more touch sensors, gesture sensors, motion detectors, etc. According to some implementations, the optional sensor system 230 may include one or more cameras. In some implementations, the cameras may be free-standing cameras. In some examples, one or more cameras of the optional sensor system 230 may reside in a smart audio device, which may be a single purpose audio device or a virtual assistant. In some such examples, one or more cameras of the optional sensor system 230 may reside in a television, a mobile phone or a smart speaker. In some examples, the apparatus 200 may not include a sensor system 230. However, in some such implementations the apparatus 200 may nonetheless be configured to receive sensor data for one or more sensors in an audio environment via the interface system 210.

In some implementations, the apparatus 200 may include the optional display system 235 shown in FIG. 2. The optional display system 235 may include one or more displays, such as one or more light-emitting diode (LED) displays. In some instances, the optional display system 235 may include one or more organic light-emitting diode (OLED) displays. In some examples, the optional display system 235 may include one or more displays of a television. In other examples, the optional display system 235 may include a laptop display, a mobile device display, or another type of display. In some examples wherein the apparatus 200 includes the display system 235, the sensor system 230 may include a touch sensor system and/or a gesture sensor system proximate one or more displays of the display system 235. According to some such implementations, the control system 210 may be configured for controlling the display system 235 to present one or more graphical user interfaces (GUIs).

According to some such examples the apparatus 200 may be, or may include, a smart audio device. In some such implementations the apparatus 200 may be, or may include, a wakeword detector. For example, the apparatus 200 may be, or may include, a virtual assistant.

Figure 3:
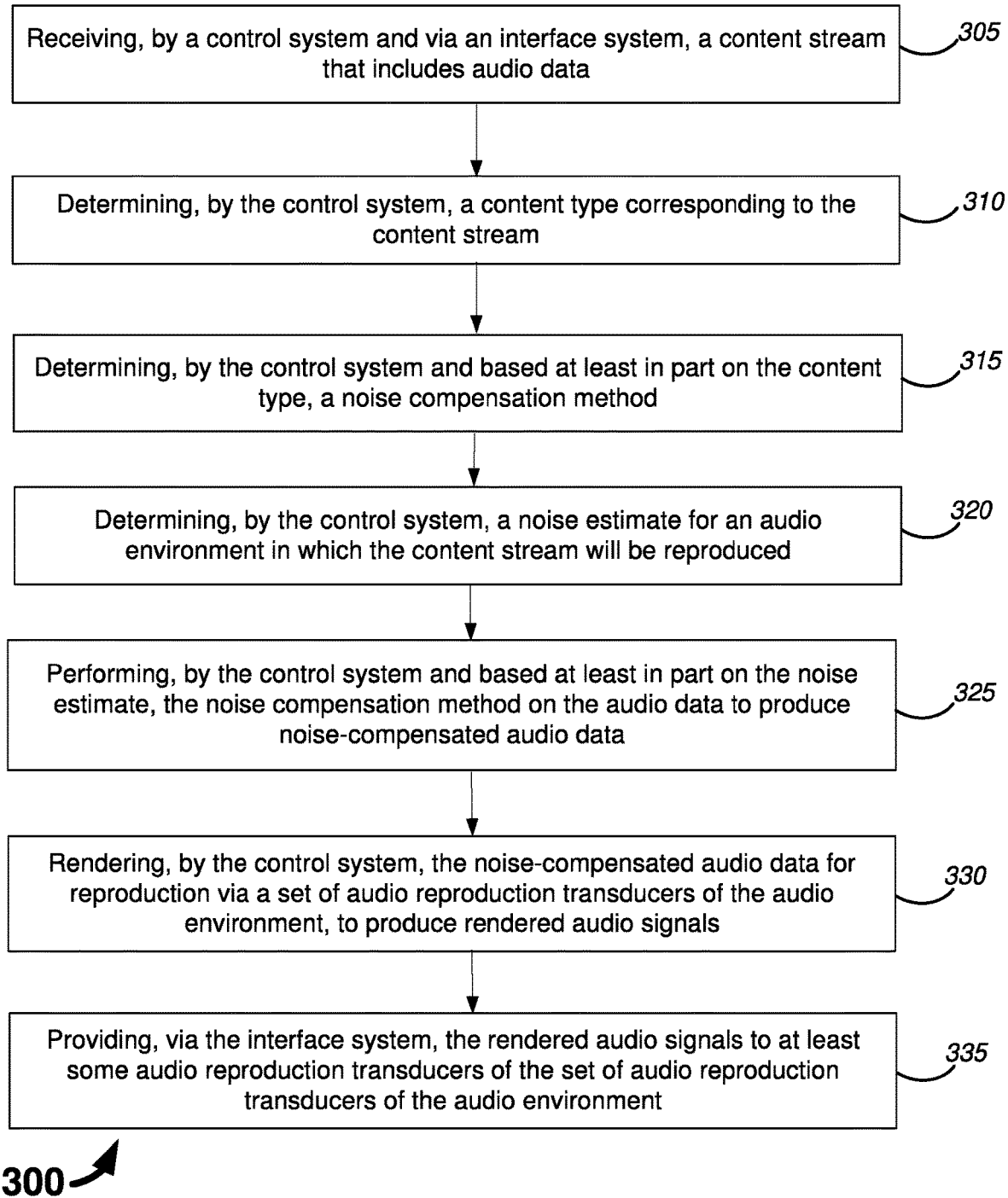
FIG. 3 is a flow diagram that outlines one example of a disclosed method.

FIG. 3 is a flow diagram that outlines one example of a disclosed method. The blocks of method 300, like other methods described herein, are not necessarily performed in the order indicated. Moreover, such methods may include more or fewer blocks than shown and/or described.

The method 300 may be performed by an apparatus or system, such as the apparatus 200 that is shown in FIG. 2 and described above. In some examples, the blocks of method 300 may be performed by one or more devices within an audio environment, e.g., an audio system controller or another component of an audio system, such as a smart speaker, a television, a television control module, a smart speaker, a mobile device, etc. In some implementations, the audio environment may include one or more rooms of a home environment. In other examples, the audio environment may be another type of environment, such as an office environment, an automobile environment, a train environment, a street or sidewalk environment, a park environment, etc. However, in alternative implementations at least some blocks of the method 300 may be performed by a device that implements a cloud-based service, such as a server.

In this implementation, block 305 involves receiving, by a control system and via an interface system, a content stream that includes audio data. In some examples, the content stream may include video data corresponding to the audio data. In some implementations, the control system and the interface system may be the control system 210 and the interface system 205 shown in FIG. 2 and described above. According to some implementations, block 305 may involve receiving an encoded content stream. In such implementations, block 305 may involve decoding the encoded content stream. The content stream may, for example, correspond to a movie, a television program, music, a music video, a podcast, etc.

In this example, block 310 involves determining, by the control system, a content type corresponding to the content stream. According to some examples, determining the content type may involve selecting a content type from a plurality of content types. The plurality of content types may, for example, include at least one movie content type, at least one television program content type, at least one music content type and/or at least one other content type.

In some implementations, the control system may be configured to implement an audio classifier. In some such examples, determining the content type may be based, at least in part, on an audio classification produced by the audio classifier.

In some instances, determining the content type may be based, at least in part, on determining a content provider for the content stream. For example, if the control system determines that the content provider is a music streaming service, in some implementations the control system may determine that the content type is a musical content type. However, if the control system determines that the content provider is a movie and/or television program streaming service, in some implementations the control system may determine that the content type is a movie or a television program. In some examples, determining the content type may be based, at least in part, on determining an application that implements decoding of the content stream.

In some implementations, determining the content type may be based, at least in part, on user input, such as user input regarding the content stream. For example, the user input may be a selection of a particular content streaming service. In some examples, the user input may be a selection of music, a selection of a movie, a selection of a television program, etc. In some instances, the user input may be received via a voice command to a virtual assistant.

According to some implementations, the content stream may include content metadata. In some such examples, determining the content type may be based, at least in part, on the content metadata.

According to this example, block 315 involves determining, by the control system and based at least in part on the content type, a noise compensation method. In some such examples, determining the noise compensation method may involve selecting the noise compensation method from a plurality of noise compensation methods. Each of the noise compensation methods may correspond to one or more content types of a plurality of content types. However, in some alternative examples, determining the noise compensation method may not be based on the content type.

In some examples, the noise compensation method for at least one music content type may be what is referred to herein as a "timbre-preserving" noise compensation method. The term "timbre-preserving" may have a variety of meanings as used herein. Broadly speaking, a "timbre-preserving" noise compensation method is one that at least partially preserves the frequency content, or timbre of an input audio signal. Some timbre-preserving noise compensation methods may completely, or almost completely, preserve the frequency content of an input audio signal. A timbre-preserving noise compensation method may involve constraining the output signal level of at least some frequency bands according to the output signal level and/or imposed thresholds of at least some other frequency bands. In some examples, a "timbre-preserving" noise compensation method may involve constraining, at least to some degree, the output signal level of all non-isolated frequency bands. (In some examples, if a frequency band is "isolated," then only the audio in that frequency band has an effect on the limiting gain that is applied.) Various examples of timbre-preserving noise compensation methods are disclosed herein. In some examples, the noise compensation method for at least one music content type may involve a first method corresponding to a lower frequency range and a second method corresponding to an upper frequency range. The first method may, for example, involve allowing a first gain applied to a first frequency band in the lower frequency range to be independent of a second gain applied to a second frequency band in the lower frequency range.

In some implementations, the second method may involve constraining all gains applied in frequency bands of the upper frequency range to be equal. According to some implementations, the second method may involve constraining a difference between a first gain and a second gain to be less than or equal to a threshold amount. In some such implementations, the first gain may be applied in a first frequency band of the upper frequency range and the second gain may be applied in a second frequency band of the upper frequency range. The first frequency band may, for example, be adjacent to the second frequency band.

According to some examples, determining the noise compensation method may be based, at least in part, on a time of day. In some such examples, determining the noise compensation method may not be based on input content type. In some examples, a nighttime noise compensation method may involve controlling playback levels of one or more frequency bands of reproduced audio data to be lower than playback levels of the same frequency band(s) of reproduced audio data corresponding to a daytime noise compensation method. According to some examples, playback levels of a nighttime noise compensation method may be more compressed than playback levels of a daytime noise compensation method. In some implementations, a nighttime noise compensation method may involve controlling playback levels of one or more frequency bands of reproduced audio data to be lower than a threshold, even in the presence of a loud noise source. The frequency band(s) may, for example, be bass frequency bands.

Some disclosed noise compensation method implementations involve controlling a playback level of reproduced audio data to be higher than an ambient noise level. However, in some examples, determining the noise compensation method in block 315 may be based, at least in part, on a type of ambient noise in the audio environment. In some such examples, determining the noise compensation method may not be based on input content type. In some instances, the type of ambient noise may correspond to conversation. In some such examples, the noise compensation method may involve controlling a playback level of reproduced audio data to be lower than an ambient noise level.

According to some examples, method 300 may involve receiving metadata with the content stream. In some such examples, determining the noise compensation method may be based, at least in part, on the metadata. In some instances, the metadata may correspond with, and/or may indicate, the noise compensation method. For example, the metadata may indicate a timbre-preserving noise compensation method, an unconstrained noise compensation method or a noise compensation method that is a hybrid of the two. In some examples, the metadata may indicate smoothing coefficients, frequency smoothing constraints, attack times and/or release times. In some instances the metadata may be provided by an encoder. However, in other examples the metadata may be provided by another device of an audio environment, such as a smart home hub. In some examples, the metadata may correspond with a dynamic range of the audio data and/or an amount of compression that has been applied to the audio data. For example, the metadata may be "dialnorm" metadata of the Dolby Digital, Dolby Digital Plus or AC-4 audio technology. In some instances, the metadata may be "reference level" metadata of the High-Efficiency Advanced Audio Coding audio coding format. Alternatively, or additionally, determining the noise compensation method may be based, at least in part, on a dynamic range of at least one audio reproduction transducer of the audio environment.

In some examples, at least one noise compensation method may be a demonstration or "demo" version and another noise compensation method may be a regular version. The regular version may be a version that is designed for normal usage, e.g., usage under normal circumstances of a home audio environment or another audio environment. The demonstration version may be suitable, for example, for a showroom environment, a retail environment, a sales environment, etc. The demonstration version may, for example, involve applying higher gains than the regular version in one or more frequency bands.

In this example, block 320 involves determining, by the control system, a noise estimate for an audio environment in which the content stream will be reproduced. Determining a noise estimate may also be referred to herein as determining a noise metric.

According to some examples, determining the noise metric may involve receiving, by the control system, microphone data from one or more microphones of an audio environment in which the audio data will be rendered and determining, by the control system, the noise metric based, at least in part, on the microphone signals. Some such examples may involve receiving microphone data from one or more microphones of an audio environment in which the control system resides. In some such implementations, the microphone signals may be received from a device that includes at least one microphone and at least one audio reproduction transducer of the set of audio reproduction transducers of the environment. For example, the device that includes at least one microphone and at least one audio reproduction transducer may be, or may include, a smart speaker. However, some alternative examples may involve receiving microphone data or a noise metric from one or more devices of an audio environment that is not in the same location as the control system.

According to some examples, determining the noise metric may involve identifying environmental noise in received microphone signals and estimating a noise level corresponding to the environmental noise. In some such examples, determining the noise metric may involve determining whether the noise level is above or below one or more thresholds. In some examples, the noise estimate may indicate an estimated noise level for each of a plurality of frequency bands.

In some examples, determining the noise metric may involve determining one or more metrics corresponding to the reverberance of the environment, the frequency response of the environment, playback characteristics of one or more audio reproduction transducers of the environment, etc.

In some instances, determining the noise estimate may involve receiving the noise estimate from a noise estimation module or calculating the noise estimate based on microphone signals of one or more microphones in the audio environment.

According to this implementation, block 325 involves performing, by the control system and based at least in part on the noise estimate, the noise compensation method on the audio data to produce noise-compensated audio data. Here, block 330 involves rendering, by the control system, the noise-compensated audio data for reproduction via a set of audio reproduction transducers of the audio environment, to produce rendered audio signals. In this example, block 335 involves providing, via the interface system, the rendered audio signals to at least some audio reproduction transducers of the set of audio reproduction transducers of the audio environment.

Figure 4:
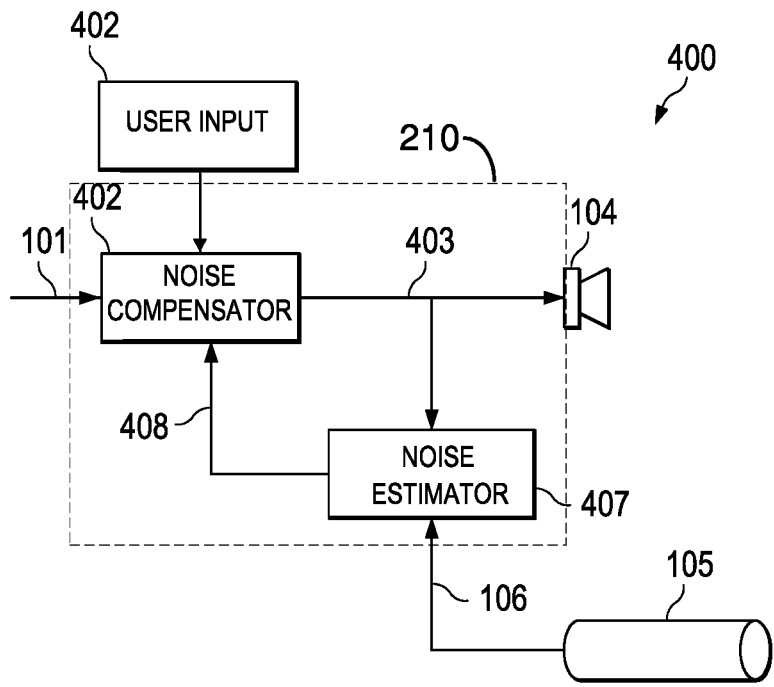
FIG. 4 shows an example of a system in which a noise compensation method is based, at least in part, on user input.

FIG. 4 shows an example of a system in which a noise compensation method is based, at least in part, on user input. As with other figures provided herein, the types and numbers of elements shown in FIG. 4 are merely provided by way of example. Other implementations may include more, fewer and/or different types and numbers of elements.

In this example, the system 400 includes a loudspeaker 104, a microphone 105, a noise estimator 407 and a noise compensator 402. In this example, the noise estimator 407 and the noise compensator 402 are implemented by a control system, which is an instance of the control system 210 of FIG. 2 in this example. According to this implementation, the control system 210 includes an interface system that is configured for receiving user input 402. In some examples, the system 400 may include a display system and the control system 210 may be configured to provide one or more graphical user interfaces for receiving user input 402 on the display system. In some implementations, the control system 210 may be configured for receiving user input 402 via speech received by the microphone 105. In some such implementations, the control system 210 may be configured for implementing, at least in part, an automatic speech recognition (ASR) process. According to some such implementations, the control system 210 may be configured for implementing a cloud-based ASR process. In some examples, another device in the system 400, such as a virtual assistant, may be configured for receiving speech commands and for providing signals to the control system 210 corresponding to the user input 402.

In this example, the noise compensator 402 is receiving audio signals 101 from a file, a streaming service, etc. According to this example, the noise compensator 402 is configured for determining a noise compensation method for the audio signals 101 based, at least in part, on user input 402. The user input 402 may, in some instances, be an express selection of a noise compensation method, e.g., a noise compensation method for music, a noise compensation method for a movie, a noise compensation method for a television program, etc. The user input 402 may, in some examples, correspond to a selection from two or more pre-set noise compensation methods.

However, in some instances the user input 402 may not involve a direct or express selection of a noise compensation method. For example, the user input 402 may correspond with a content type of a content stream that includes the audio signal 101. According to some such examples, the noise compensator 402 may be configured for determining a noise compensation method based, at least in part, on the content type. The user may or may not be provided with information that a noise compensation method is being selected according to the content type, depending on the particular implementation.

In some instances, the user input 402 may correspond with a content provider for the content stream. The control system 210 may be configured for determining the content type may be based, at least in part, on the content provider. For example, if the control system determines that the content provider is a music streaming service, in some implementations the control system may determine that the content type is a musical content type. However, if the control system determines that the content provider is a movie and/or television program streaming service, in some implementations the control system may determine that the content type is a movie or a television program. In some examples, determining the content type may be based, at least in part, on user input 402 corresponding to the selection of an application that implements decoding of the content stream.

In this example, the noise compensator 402 sends a noise-compensated output signal 403 to the loudspeaker 104. According to this example, the noise-compensated output signal 403 is also provided to, and is a reference signal for, the noise estimator 407. In this example, microphone signals 106 are also sent to the noise estimator 407 from the microphone 105.

According to this example, the noise estimator 407 is a component that is configured to estimate the level of noise in an environment that includes the system 400. The noise estimator 407 may be configured to receive the microphone signals 106 and to calculate how much of the microphone signals 106 consist of noise and how much is due to the playback of the loudspeaker 104. The noise estimator 407 may, in some examples, include an echo canceller. However, in some implementations the noise estimator 407 may simply measure the noise when a signal corresponding with silence is sent to the loudspeaker 104. In this example, the noise estimator 407 is providing a noise estimate 408 to the noise compensator 402. The noise estimate 408 may be a broadband estimate or a spectral estimate of the noise, depending on the particular implementation. In this example, the noise compensator 402 is configured to adjust the level of the output of the loudspeaker 104 based upon the noise estimate 408.

Figure 5A:
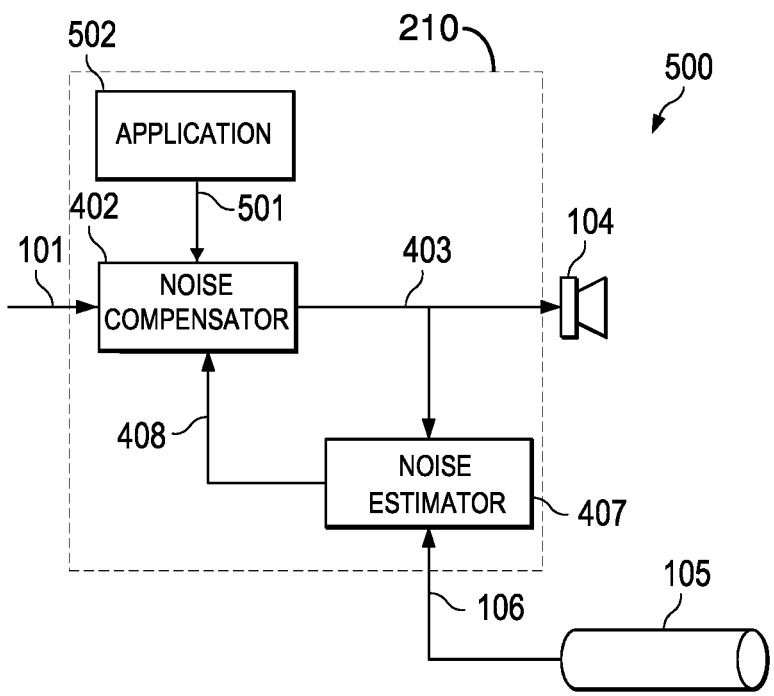
FIG. 5A shows an example of a system in which a noise compensation method is based, at least in part, on application type information.

FIG. 5A shows an example of a system in which a noise compensation method is based, at least in part, on application type information. As with other figures provided herein, the types and numbers of elements shown in FIG. 5A are merely provided by way of example. Other implementations may include more, fewer and/or different types and numbers of elements.

In this example, the system 500 includes a loudspeaker 104, a microphone 105, a noise estimator 407 and a noise compensator 402. In this example, the noise estimator 407 and the noise compensator 402 are implemented by a control system, which is an instance of the control system 210 of FIG. 2 in this example. According to this example, the control system 210 is executing a software application 502, which may be referred to herein as an "application."

In this example, the noise compensator 402 is receiving an audio signal 101 from a file, a streaming service, etc. According to this example, the noise compensator 402 is configured for determining a noise compensation method based, at least in part, on the application 502 that is currently being executed by the control system 210. In this example, the noise compensator 402 is configured for determining a noise compensation method based, at least in part, on a signal 501 indicating the application 502 that is running on the control system 210. If, for example, the application 502 is a music-related application, the noise compensator 402 may be configured for determining a noise compensation method that is appropriate for music. Some detailed examples are described below. If, for example, the application 502 is a video application, the noise compensator 402 may be configured for determining a noise compensation method that is appropriate for movies and/or for television programs.

In some instances, the application 502 may be an application that implements decoding of a content stream that includes audio for which the noise compensator 402 will determine a noise compensation method. The noise compensator 402 may be configured for determining a content type for the content stream and may be configured for determining a noise compensation method corresponding to the content type. For example, encoded video/audio may indicate the content type as part of the bitstream, e.g., via metadata indicating that the content is a movie, a television program or music. The application 502 may provide a signal 501 to the noise compensator 402 indicating the content type. The application 502 does not need to "know" (e.g., to be provided with information about the fact) that the application 502 is providing information to and/or being integrated into a noise compensation system. For example, an operating system running on the control system 210 may indicate to the noise compensator 402 what applications are playing audio at the time and the noise compensator 402 may be configured to changes its processing accordingly, e.g., based upon a mapping between application names, content types and corresponding noise compensation methods.

In some instances, the application 502 may be based directly or indirectly on user input, e.g., as described above with reference to FIG. 4. The user input may, in some instances, correspond with a selection of an application 502 that corresponds with a content provider for the content stream. The control system 210 may be configured for determining the content type may be based, at least in part, on the content provider. For example, if the control system determines that the user-selected application 502 is an application provided by a music streaming service, in some implementations the control system may determine that the content type is a musical content type. However, if the control system determines that the user-selected application 502 is an application provided by a movie and/or television program streaming service, in some implementations the control system may determine that the content type is a movie or a television program.

Figure 5B:
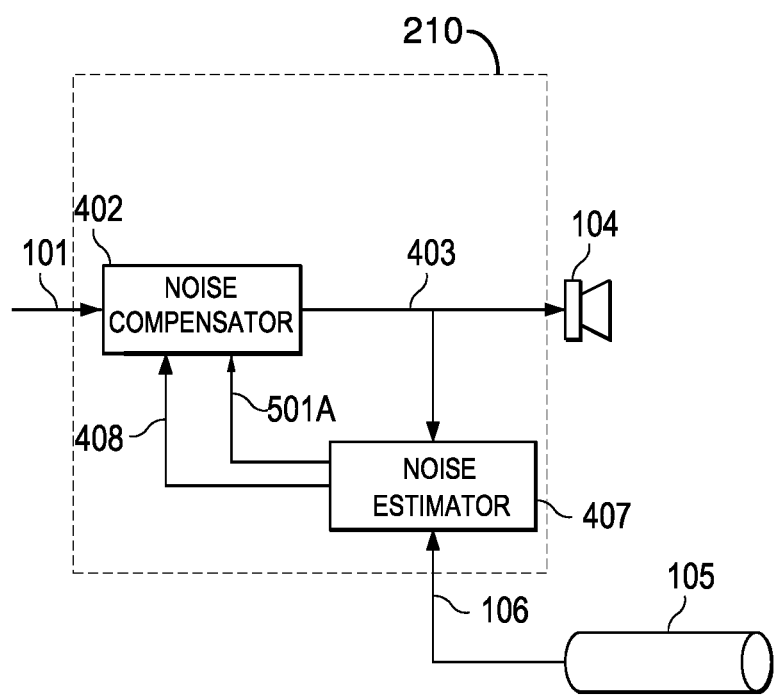
FIG. 5B shows an example of a system in which a noise compensation method is based, at least in part, on the state of a noise estimator.

FIG. 5B shows an example of a system in which a noise compensation method is based, at least in part, on the state of a noise estimator. As with other figures provided herein, the types and numbers of elements shown in FIG. 5B are merely provided by way of example. Other implementations may include more, fewer and/or different types and numbers of elements.

In this example, the system 500 includes a loudspeaker 104, a microphone 105, a noise estimator 407 and a noise compensator 402. In this example, the noise estimator 407 and the noise compensator 402 are implemented by a control system, which is an instance of the control system 210 of FIG. 2 in this example. In this example, the noise compensator 402 is receiving an audio signal 101 from a file, a streaming service, etc.

According to this example, the noise compensator 402 is configured for determining a noise compensation method based, at least in part, on the state of the noise estimator 407. In this example, the noise estimator 407 is providing noise estimator state information 501A to the noise compensator 402. Accordingly, in some implementations the noise compensator 402 may be configured for determining a noise compensation method based, at least in part, on the noise estimator state information 501A.

In some examples, the noise estimator 407 may determine which noise compensation method should be implemented by the noise compensator 402. In some such examples, the noise estimator state information 501A may indicate to the noise compensator 402 (e.g., via the noise estimator state information 501A and/or via additional information) which noise compensation method should be implemented by the noise compensator 402.

In some implementations in which the noise estimator 407 is a multiple frequency band noise estimator, if the noise estimate in a set of non-updated frequency bands (e.g. in the upper frequency bands) has not been updated for a threshold amount of time (e.g., on the order of seconds, such as 1 second, 2 seconds, 3 seconds, 4 seconds, 5 seconds, etc.), the noise estimator state information 501A may indicate that the noise compensation method should switch to the timbre-preserving or "music mode" because the quality of the noise estimate in the non-updated frequency bands is low, although the quality of the noise estimate in the updated frequency bands may still be high. Alternatively, or additionally, in some implementations, the noise estimator may be configured to provide a quality metric or confidence score to the noise compensation block, which the noise compensation block may use to determine which mode to be in (or be partially in). For example, the noise compensation block may determine that the noise compensation method should be the timbre-preserving or "music mode" if the quality metric or confidence score indicates that the quality of the noise estimate is low. In some examples, the quality metric may be directly related to the "staleness" metric that is described in International Publication No. WO 2019/209973, filed on Apr. 24, 2019 and entitled "Background Noise Estimation Using Gap Confidence," particularly the discussion of the "staleness" metric on pages 24 and 25, which is hereby incorporated by reference.

In some implementations, the control system 210 (e.g., the noise estimator 407) may be configured to provide the multiple frequency band noise estimator functionality that is described in International Publication No. WO 2019/209973, filed on Apr. 24, 2019 and entitled "Background Noise Estimation Using Gap Confidence," particularly the discussion of gap confidence values and the use of gap confidence values on pages 16-18, which is hereby incorporated by reference.

Figure 10:
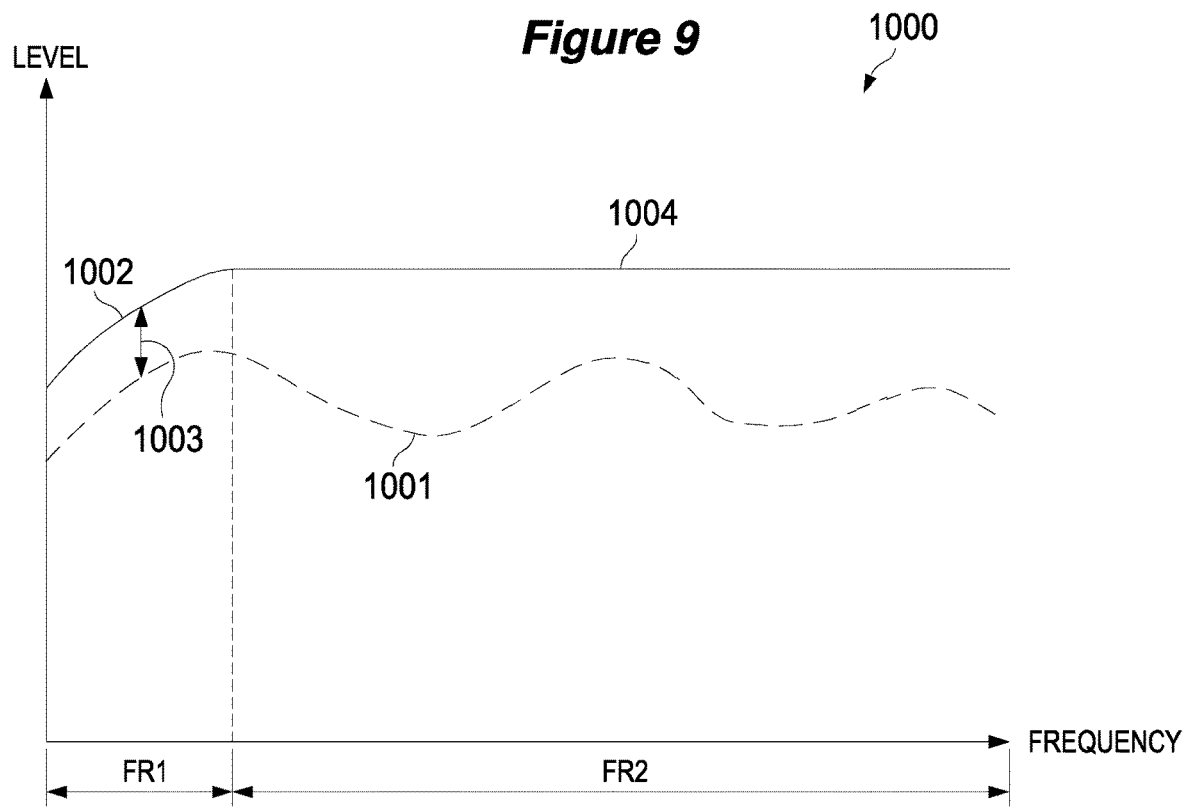
FIG. 10 shows an example of a graph corresponding to another noise compensation method.

According to some implementations, the frequency bands that are in a timbre preservation frequency range (e.g., the range FR2 that is shown in FIG. 10 and described below) may be chosen according to a metric of quality for the noise estimate. The metric of quality for the noise estimate may, for example, correspond with the amount of time since a noise estimate for a frequency band has been updated.

Figure 6:
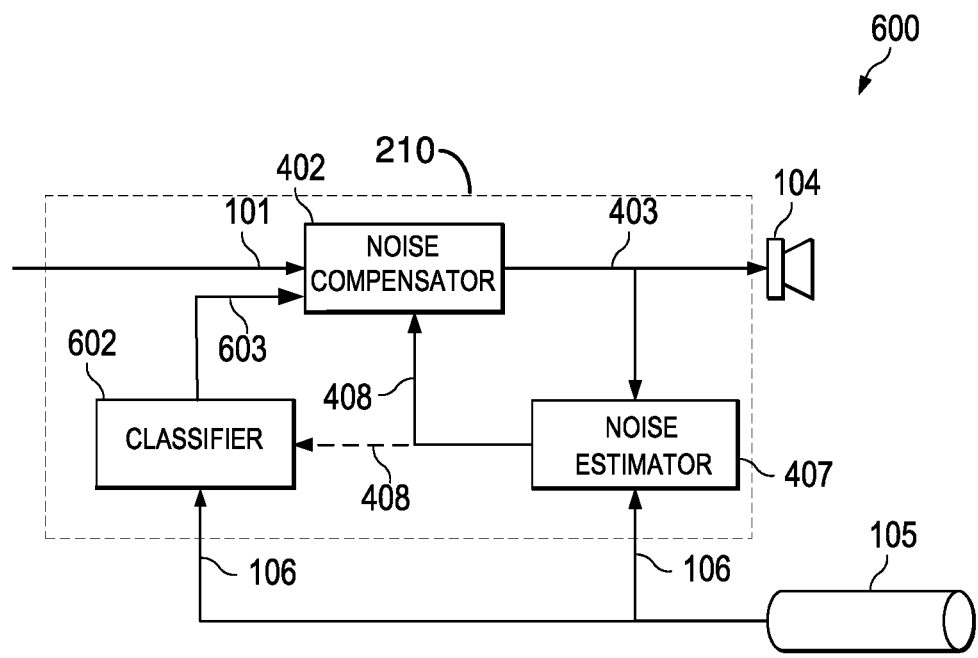
FIG. 6 shows an example of a system in which a noise compensation method is based, at least in part, on a classification of the environmental noise in an audio environment.

FIG. 6 shows an example of a system in which a noise compensation method is based, at least in part, on a classification of the environmental noise in an audio environment. As with other figures provided herein, the types and numbers of elements shown in FIG. 6 are merely provided by way of example. Other implementations may include more, fewer and/or different types and numbers of elements.

In this example, the system 600 includes a classifier 602, a loudspeaker 104, a microphone 105, a noise estimator 407 and a noise compensator 402. In this example, the classifier 602, the noise estimator 407 and the noise compensator 402 are implemented by a control system, which is an instance of the control system 210 of FIG. 2 in this example.

According to this example, the noise compensator 402 is configured for determining a noise compensation method for the input audio signals 101 based, at least in part, on the noise estimate 408 from the noise estimator 407 and the signals 603 that are output by the classifier 602. In some examples, the signals 603 may indicate the type of noise compensation method that the noise compensator 402 should implement. Alternatively, or additionally, the signals 603 may indicate a set of frequency gains that the noise estimator 407 should apply, in addition to the noise compensation that the noise estimator 407 would apply based on the noise estimate 408.

In some example, the signals 603 may indicate the type of environmental noise. The noise compensator 402 may determine the type of noise compensation method to implement based, at least in part, on the type of environmental noise. For example, the noise compensator 402 may be configured for determining one type of noise compensation method if the classifier 602 determines that the ambient sounds are human voices and another type of noise compensation method if the classifier 602 determines that the ambient sounds are environmental noise, such as a vacuum cleaner, a blender, an HVAC (heating, ventilation and air conditioning) system, etc.

For example, if the classifier 602 determines that the ambient sounds correspond to speech (e.g., speech corresponding to one or more persistent conversations in the audio environment), in some implementations the signals 603 that are output by the classifier 602 may indicate that the noise compensator 402 should duck (reduce the level of) the audio 101 such that the reproduced audio remains below the level of speech. In some such examples, determining the noise compensation method may not be based on input content type. A more detailed example is described below with reference to FIG. 11.

In some examples, if the classifier 602 determines that the environmental noise is music, the signals 603 may indicate that the noise compensator 402 should disable noise compensation. Disabling a noise compensation process may ensure that the noise compensation implemented by the system 600 and the noise compensation implemented by another system that is reproducing the music are not each attempting to increase the level of reproduced music over that reproduced by the other system.

According to some examples, if the classifier 602 determines that the ambient noise is engine noise, blender noise, traffic noise, street noise, etc., the signals 603 may indicate that the noise compensator 402 should implement another type of noise compensation. In some such examples, the signals 603 may indicate that the noise compensator 402 should operate as described above with reference to the noise compensator 402 of FIG. 4.

In this example, the noise estimator 407 is providing a noise estimate 408 to the noise compensator 402 and, optionally, to the classifier 602. The noise estimate 408 may be a broadband estimate or a spectral estimate of the noise, depending on the particular implementation.

According to this example, the classifier 602 is configured to receive microphone signals 106 from the microphone 105. In some implementations, the classifier 602 is configured to receive the noise estimate 408 from the noise estimator 407. Based on one or both of these inputs, in this implementation the classifier 602 is configured to determine a type of ambient noise, which may also be referred to herein as environmental noise. In some implementations, the classifier 602 may be configured to determine the type of ambient noise by implementing one or more audio-based context awareness models. Some such implementations may use Mel-frequency cepstral coefficients and their derivatives as features, and hidden Markov models (HMMs) (e.g., continuous density HMMs) as acoustic models. In some implementations, the classifier 602 may be configured to determine the type of ambient noise by implementing a neural network that has been trained according to one or more audio-based context awareness models. Alternatively, or additionally, the noise estimator 407 may be configured to determine a type of ambient noise by one or more of the foregoing processes.

The time over which the ambient noise is evaluated (the window size) may, in some instances, affect the results obtained by the classifier 602 and/or the noise estimator 407. For example, a longer time window may be appropriate for determining persistent environmental noise, such as HVAC noise. According to some implementations, during an encoding process, an encoder identifies transient content when allocating bits, including changing the window size. In some such implementations, the window size and transient may be encoded and represented with metadata. Accordingly, in some such examples, this metadata may be provided to a control system that is configured to implement noise compensation and/or ambient noise classification, in order to inform the related audio processing.

Figure 7:
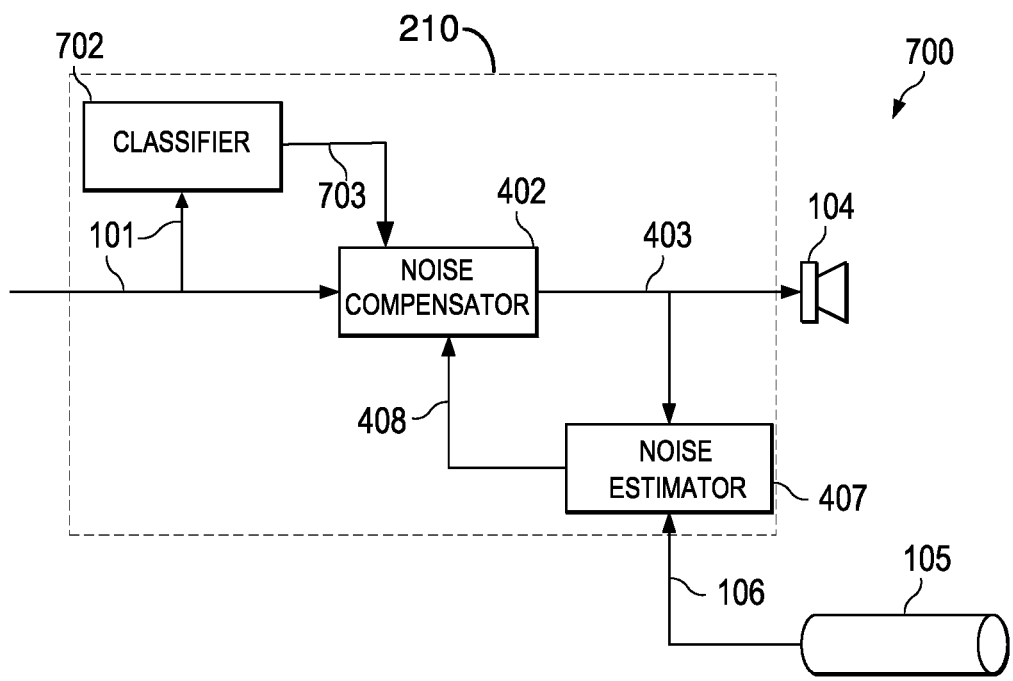
FIG. 7 shows an example of a system in which a noise compensation method is based, at least in part, on a classification of an input content stream.

FIG. 7 shows an example of a system in which a noise compensation method is based, at least in part, on a classification of an input content stream. As with other figures provided herein, the types and numbers of elements shown in FIG. 7 are merely provided by way of example. Other implementations may include more, fewer and/or different types and numbers of elements.

In this example, the system 700 includes a classifier 702, a loudspeaker 104, a microphone 105, a noise estimator 407 and a noise compensator 402. In this example, the classifier 702, the noise estimator 407 and the noise compensator 402 are implemented by a control system, which is an instance of the control system 210 of FIG. 2 in this implementation.

According to this example, the noise compensator 402 is configured for determining a noise compensation method for the input audio signals 101 based, at least in part, on the noise estimate 408 from the noise estimator 407 and the signals 703 that are output by the classifier 702. In some examples, the signals 703 may indicate the type of noise compensation method that the noise compensator 402 should implement. Alternatively, or additionally, the signals 703 may indicate a set of frequency gains that the noise estimator 407 should apply, in addition to the noise compensation that the noise estimator 407 would apply based on the noise estimate 408.

In some implementations, the signals 703 may indicate the type of content of at least a portion of the input content stream. In some examples, the noise compensator 402 may be configured for determining one type of noise compensation method if the classifier 702 determines that the input audio 101 corresponds to music and another type of noise compensation method if the classifier 702 determines that the input audio 101 corresponds to a movie or a television program. Some detailed examples of each type of noise compensation method are described below.

In some examples, the classifier 702 may determine that the noise compensation method should change even if the same movie, television program, etc., is being input and reproduced by the system 700. For example, a movie or a television program may include a musical introduction and/or an intermission during which music is being reproduced. For these segments of the movie or the television program, the classifier 702 may determine that the noise compensation method should correspond to music.

In some implementations, the classifier 702 may have previously determined that the content (e.g., the input audio 101) corresponds primarily to a movie or a television program, but that one or more portions of the content is a blend of, e.g., movie content and musical content. If, for example, the classifier 702 determines that a portion of the content is a combination of movie content and musical content, in some implementations the noise compensator 402 will implement a hybrid noise compensation method that combines aspects of a music noise compensation method and a movie noise compensation method. Although other examples may not expressly mention hybrid noise compensation methods, hybrid noise compensation methods are broadly applicable to many disclosed implementations. In some examples, the hybrid noise compensation method may be an average of a first set of frequency gains that the noise estimator 407 should apply for music and a second set of frequency gains that the noise estimator 407 should apply for movie content or television content. According to some such examples, if the classifier 702 were to determine that the portion of content is 50% movie content and 50% musical content, in some implementations the noise compensator 402 will implement a hybrid noise compensation method that averages the gains that would be applied according to a music noise compensation method and the gains that would be applied according to a movie noise compensation method. In some such implementations, the average may be weighted according to whether the classifier 702 determines that the input audio 101 is music-dominant or movie-dominant, e.g., based on whether there is dialogue at a particular time, the level of the dialogue compared to the level of music, etc. In some examples, if the classifier 702 were to determine that the portion of content is X % movie content and Y % musical content, the noise compensator 402 may be configured to implement a hybrid noise compensation method that applies X % of the gains that would be applied according to a movie noise compensation method and Y % of the gains that would be applied according to a music noise compensation method.

In some implementations, the classifier 702 may be configured for receiving metadata that is included with the input audio 101 and/or included with other content that is received along with the input audio 101. According to some such implementations, the signals 703 that are output by the classifier 702 may correspond to the metadata. The metadata may, for example, indicate whether the content is a movie, is a television program, etc. In some instances, the metadata may indicate whether a particular portion of the content is primarily music, primarily dialogue, etc. According to some examples, the metadata may correspond to a dynamic range of the audio data and/or a level of compression that has been applied to the audio data. In some such examples, the metadata may be dialnorm metadata of Dolby Digital, Dolby Digital Plus or AC-4. In some instances, the metadata may be reference level metadata of the High-Efficiency Advanced Audio Coding audio coding format.

In some implementations, the classifier 702 may be configured for comparing a histogram of the input audio 101 and for matching a spectral shape of the input histogram with a histogram of a known type of audio, such as a movie histogram, a noise histogram or a music histogram. In some such examples, the classifier 702 may be configured for implementing a "media intelligence" classifier developed by Dolby. According to some such examples, the classifier 702 may be configured for: extracting short-term features from short-term audio segments each comprising a sequence of audio frames; classifying a sequence of short-term segments in a long-term audio segment into short-term audio types using respective short-term features; calculating the statistics of the results of classifying operation with respect to the sequence of short-term segments in the long-term audio segment, as long-term features; and classifying the long-term audio segment into long-term audio types using the long-term features, e.g., as described in U.S. patent application Ser. No. 14/779,322, filed on 25 Mar. 2014 and entitled Apparatuses and Methods for Audio Classifying and Processing (issued as U.S. Pat. No. 9,842,605), which is hereby incorporated by reference.

Figure 8:
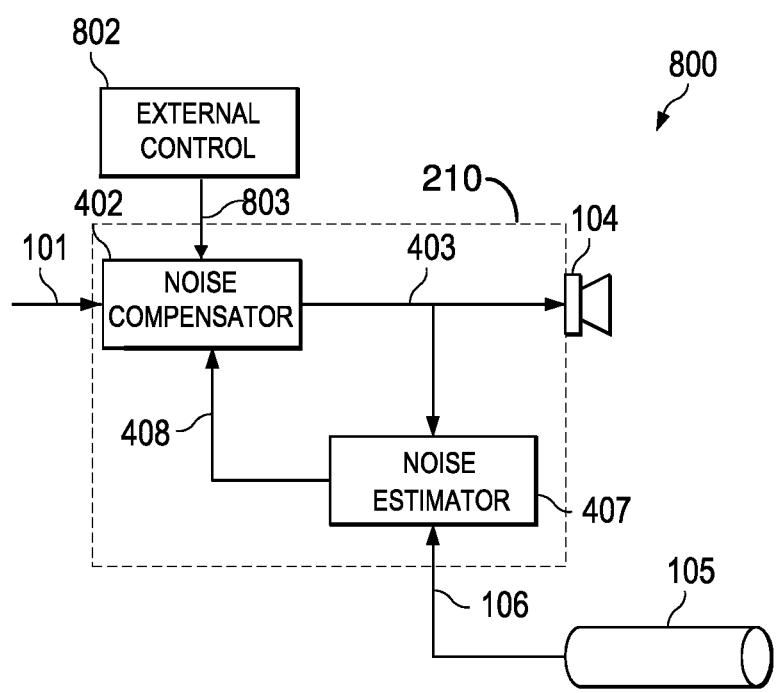
FIG. 8 shows an example of a system in which a noise compensation method is based, at least in part, on an external control.

FIG. 8 shows an example of a system in which a noise compensation method is based, at least in part, on an external control. As with other figures provided herein, the types and numbers of elements shown in FIG. 8 are merely provided by way of example. Other implementations may include more, fewer and/or different types and numbers of elements.

In this example, the system 800 includes an external control module 802, a loudspeaker 104, a microphone 105, a noise estimator 407 and a noise compensator 402. In this example, the noise estimator 407 and the noise compensator 402 are implemented by a control system, which is an instance of the control system 210 of FIG. 2 in this example. In some implementations, the external control module 802 also may be implemented via the control system 210.

According to this example, the noise compensator 402 is configured for determining a noise compensation method for the input audio signals 101 based, at least in part, on the noise estimate 408 from the noise estimator 407 and the signals 803 that are output by the external control module 802. According to some implementations, the signals 803 may correspond to time, e.g., to the time of day. In some examples, the signals 803 may indicate the type of noise compensation method that the noise compensator 402 should implement. Alternatively, or additionally, the signals 803 may indicate a set of frequency gains that the noise estimator 407 should apply, in addition to the noise compensation that the noise estimator 407 would apply based on the noise estimate 408.

In some implementations, if the external control module 802 determines that it is daytime, the signals 803 may indicate a type of noise compensation method and/or an audio reproduction method that is appropriate for daytime. According to some such some implementations, if the external control module 802 determines that it is nighttime, the signals 803 may indicate a type of noise compensation method and/or an audio reproduction method that is appropriate for nighttime. According to some examples, the "nighttime" type(s) of noise compensation method and/or playback volume control (which may be referred to herein as "night mode") may be calculated to be less likely to keep others awake, annoy neighbors, etc., than the "daytime" type(s) of noise compensation method and/or playback volume control (which may be referred to herein as "day mode"). In some such examples, the night mode may involve lower levels for audio reproduction in one or more frequency bands (e.g., in bass frequency bands) than the day mode. According to some examples, the night mode may involve applying relatively lower limits on the playback levels used for noise compensation in some or all frequency bands, as compared to the limits on the playback levels used for day mode. According to some examples, the night mode may involve enabling closed captions, subtitles or surtitles, e.g., for movie content or television content.

According to some implementations, the night mode may be implemented during the daytime, e.g., according to user input. For example, the night mode method may be implemented during a child's naptime, during a study time, during a video conference time, during a meditation time, during a yoga time or during another time at which relative quiet may be desirable in or near the audio environment.

In some examples, functionality of the external control module 802 may be combined with the functionality of one or more other modules and/or inputs, such as user input, input from the classifier 602, input from the classifier 702, etc. Some such combinations may be implemented to create a system in which noise compensation acts as an "auto volume" such that the user does not need to adjust the volume control (e.g., on a remote control device) as much as would otherwise be necessary. Alternatively, or additionally, some "auto volume" implementations may involve controlling playback volume to prevent, or place limits on, sudden increases or decreases in volume, e.g., increases in volume during commercial advertisements. In some such implementations, a control system (e.g., a control system of a television (TV)) may be configured to measure an audio system's own response to determine an appropriate volume for the audio environment for a particular content type at a particular time.

Alternatively, or additionally, the control system may be configured to determine an appropriate volume for the audio environment based on user input received via a GUI, via voice commands, etc. For example, the user input may involve a set-up process in which a user indicates recurring times for implementing night mode, criteria that will trigger night mode (e.g., the initiation of a teleconference, the activation of a baby monitor, etc.) In some implementations, the signals 803 may not be based on time, but may be based on one or more other inputs, such as the initiation of a teleconference, the activation of a baby monitor, etc. However, in some such implementations the noise compensation mode that is triggered by such input(s) may correspond to a night mode of other implementations.

Alternatively, or additionally, the control system may be configured to determine an appropriate volume for the audio environment for a particular ambient noise level and/or ambient noise type at a particular time. The control system may, in some examples, be configured to implement a psychoacoustic model and/or the measured response of the loudspeaker(s) used for reproduction to estimate whether the volume is at a desirable level and make adjustments as needed.

According to some implementations, via combinations of two or more of the disclosed systems, different noise compensation methods may be triggered based on various input. For instance, night mode may be automatically triggered during a specific time of night and may automatically end during a specific time of day. In some implementations, the background music mode that is described below with reference to FIG. 11 may be automatically triggered via the detection of persistent ambient noise in the vocal frequency range, indicating probable conversation. Background music mode may, for example, be combined with day mode or night mode, depending on the time of day during which the conversation is taking place. In some implementations, the background music mode may be triggered via user input, such as a voice command, input to a GUI, etc.

Figure 9:
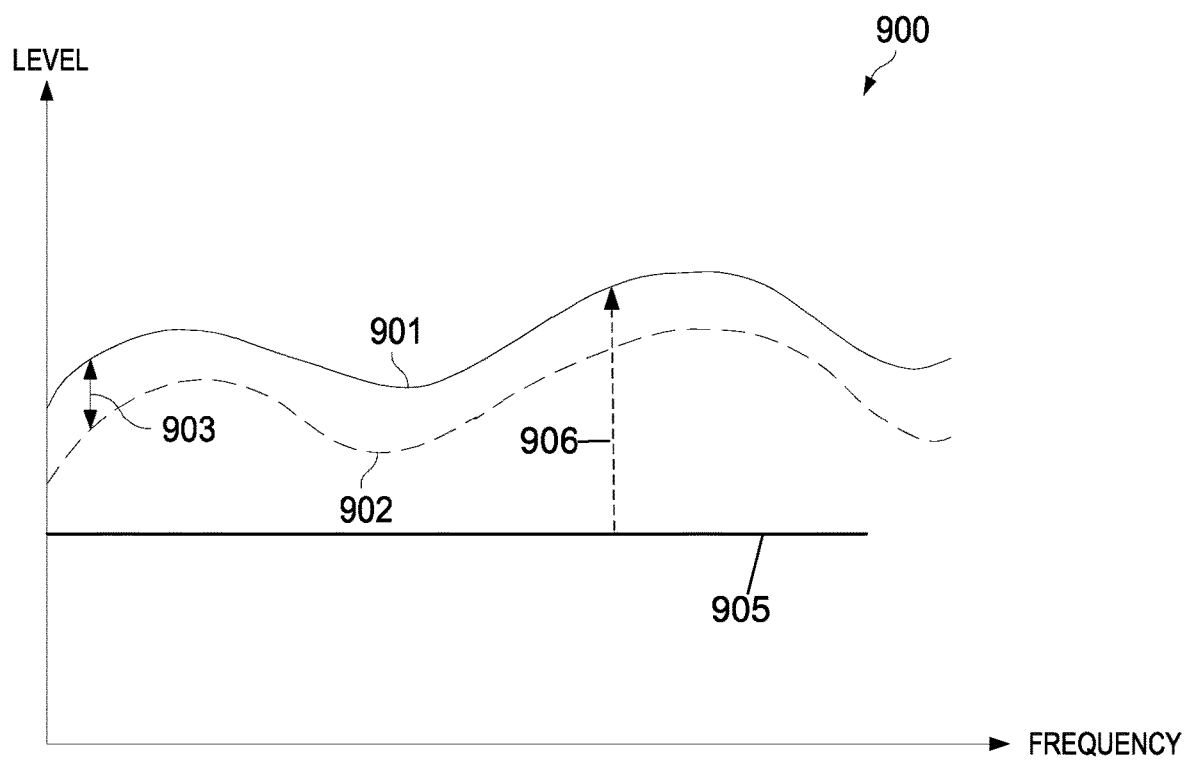
FIG. 9 shows an example of a graph corresponding to a noise compensation method.

FIG. 9 shows an example of a graph corresponding to a noise compensation method. The noise compensation method represented by the graph shown in FIG. 9 may, for example, be appropriate for a movie content type or a television program content type. As described in more detail below, the noise compensation method that may be applied when a control system determines that the input content is a movie content type or a television program content type may also be referred to herein as an "unconstrained" noise compensation method or a non-timbre-preserving noise compensation method.

In this example, the vertical axis of the graph 900 indicates level and the horizontal axis indicates frequency. In some examples, the horizontal axis may indicate frequencies in a range audible to a typical human being, e.g., in the range of 20-20,000 Hz. The graph 900 indicates an input audio signal 905, which is a white noise input audio signal in this example. The white noise input audio signal is merely used to clarify the kinds of gains that will be applied by a noise compensation system. The input audio signal 905 may have any type of frequency content. In the graphs shown in FIGS. 10-13, a white noise input signal should also be assumed. In the graph 900, the curve 902 corresponds to the spectra of detected background noise. For example, the curve 902 may correspond to a spectral estimate of the noise in the noise estimate 408 that the noise estimator 407 provides to the noise compensator 402.

According to this implementation, the arrow 906 represents the gain applied by the noise compensator 402 for a particular frequency, produce the noise-compensated output signal 901 corresponding to the noise compensation method of FIG. 9. According to this example, the arrow 906 represents an examples of the gains that are applied to audio data of an input content stream by the noise compensator 402 to produce the noise-compensated output signal 403, which corresponds to the noise-compensated output signal 901 in this instance. In this example, the noise compensation method may be applied when a control system determines that the input content is a movie content type or a television program content type.

In FIG. 9, the difference 903 represents the difference between the curve 901 and the curve 902. Accordingly, the difference 903 represents the difference between the background noise of an audio environment and the level of the noise-compensated output signal 403. In some examples, the gains that are applied by the noise compensator 402 ensure that the difference 903 is constant, or approximately constant, across the frequency range indicated in FIG. 9. According to some such examples, if the ambient noise level of the audio environment increases, the playback level of the noise-compensated output signal 403 will be increased by an amount necessary to keep the difference 903 constant, or approximately constant. In this context, "approximately" may mean within a predetermined range, e.g., within a 2% range, within a 5% range, within a 7% range, within a 10% range, within a 1 dB range, within a 2 dB range, within a 3 dB range, within a 4 dB range, etc.

In some examples, as shown in FIG. 9, the gains that are applied in one frequency band may be unconstrained with respect to the gains that are applied in another frequency band, e.g., relative to the gains that are applied in an adjacent frequency band. Therefore, the spectral content of the input audio signal 905 will generally not be preserved according to this noise compensation method. Accordingly, the noise compensation method that may be applied when a control system determines that the input content is a movie content type or a television program content type may also be referred to herein as an "unconstrained" noise compensation method or a non-timbre-preserving noise compensation method. In some instances, an unconstrained noise compensation method may be appropriate for other types of content and/or for situations in which the noise compensation method is not selected according to content type.

In some such examples, the gains that are applied by the noise compensator 402 ensure that the signal-to-noise ratio (SNR) is constant, or approximately constant, across the frequency range indicated in FIG. 9. According to some such examples, the gains that are applied in one frequency band may be unconstrained with respect to the gains that are applied in another frequency band, e.g., relative to the gains that are applied in an adjacent frequency band.

However, according to some implementations, the difference 903 and/or the SNR may not be constant, or approximately constant, across the frequency range indicated in FIG. 9. In some such examples, the level of the noise-compensated output signal 403 may be shaped to emphasize the dialog regions of the noise-compensated output signal 403, e.g., by increasing the level of the noise-compensated output signal 403 for frequencies in the range of 300 Hz. to 3,000 Hz., in the range of 80 Hz. to 260 Hz., in the range of 80 Hz. to 3,000 Hz., etc., relative to the level of the noise-compensated output signal 403 in other frequency ranges.

In some examples, the noise compensation method of FIG. 9 may be based on a psychoacoustic model. In some such examples, the noise compensation method may use equal loudness curves, which apply different gains for different frequency bands. According to some such examples, the noise compensation method may correspond to one of the Dolby Volume methods, e.g., one of those methods that are described in U.S. Pat. No. 8,090,120, entitled "Calculating and Adjusting the Perceived Loudness and/or the Perceived Spectral Balance of an Audio Signal" and filed on Oct. 25, 2005, which is hereby incorporated by reference.

FIG. 10 shows an example of a graph corresponding to another noise compensation method. The noise compensation method represented by the graph shown in FIG. 10 may, for example, be appropriate for a music content type. The noise compensation method represented by the graph shown in FIG. 10 is a timbre-preserving noise compensation method, at least for the upper frequency range (FR2). As noted elsewhere herein, a timbre-preserving noise compensation method may involve constraining the output signal level of at least some frequency bands according to the output signal level and/or imposed thresholds of at least some other frequency bands. In some examples, a "timbre-preserving" noise compensation method may involve constraining, at least to some degree, the output signal level of all non-isolated frequency bands. In some instances, a timbre-preserving noise compensation method may be appropriate for other types of content and/or for situations in which the noise compensation method is not selected according to content type.

In this example, the vertical axis of the graph 1000 indicates level and the horizontal axis indicates frequency. In some examples, the horizontal axis may indicate frequencies in a range audible to a typical human being, e.g., in the range of 20-20,000 Hz. In the graph 1000, the curve 1001 corresponds to the spectra of detected background noise. For example, the curve 1001 may correspond to a spectral estimate of the noise in the noise estimate 408 that the noise estimator 407 provides to the noise compensator 402.

According to this implementation, the curves 1002 and 1004 represent the gains that are applied by the noise compensator 402 to reproduced corresponding to a noise compensation method. According to this example, the curves 1002 and 1004 represent the gains that are applied to audio data of an input content stream by the noise compensator 402 to produce the noise-compensated output signals 403. In this example, the noise compensation method may be applied when a control system determines that the input content is a music content type.

In this example, the noise compensation method involves a first method corresponding to a lower frequency range (frequency range one, labeled "FR1" in FIG. 10) and a second method corresponding to an upper frequency range (frequency range two, labeled "FR2" in FIG. 10). Some related noise compensation methods may include three or more frequency ranges. In this example, the lower frequency range corresponds to a "bass" frequency range, which may in some examples be between 20 and 250 Hz. In other examples, the lower frequency range may be a different range, e.g., between 20 and 300 Hz., between 20 and 350 Hz., between 20 and 400 Hz., between 20 and 450 Hz., between 20 and 500 Hz., between 50 and 300 Hz., between 50 and 350 Hz., between 50 and 400 Hz., between 50 and 450 Hz., between 50 and 500 Hz., between 100 and 300 Hz., between 100 and 350 Hz., between 100 and 400 Hz., between 100 and 450 Hz., between 100 and 500 Hz., etc. In some examples, the upper frequency range may be the entire audible range above the lower frequency range. However, in some other examples the upper frequency range may be less than the entire audible range above the lower frequency range.

According to this implementation, the first method involves allowing a first gain applied to a first frequency band in the lower frequency range to be independent of a second gain applied to a second frequency band in the lower frequency range. The first frequency band may, in some instances, be adjacent to the second frequency band. Therefore, the spectral content of the input audio signals in the lower frequency range will generally not be preserved according to this noise compensation method. Accordingly, the noise compensation method may be referred to as an "unconstrained" noise compensation method or a non-timbre-preserving noise compensation method in the lower frequency range.

In FIG. 10, the difference 1003 represents the difference between the curve 1001 and the curve 1002. Accordingly, the difference 1003 represents the difference between the background noise of an audio environment and the level of the noise-compensated output signal 403 in one example of the first method. In some examples, the gains that are applied by the noise compensator 402 ensure that the difference 1003 is constant, or approximately constant, across the lower frequency range. According to some such examples, if the ambient noise level of the audio environment increases, the playback level of the noise-compensated output signal 403 will be increased by an amount necessary to keep the difference 1003 constant, or approximately constant. In this context, "approximately" may mean within a predetermined range, e.g., within a 2% range, within a 5% range, within a 7% range, within a 10% range, within a 1 dB range, within a 2 dB range, within a 3 dB range, within a 4 dB range, etc. In some examples of the first method, the gains that are applied by the noise compensator 402 ensure that the signal-to-noise ratio (SNR) is constant, or approximately constant, across the lower frequency range indicated in FIG. 10.

However, according to some implementations, the difference 1003 and/or the SNR may not be constant, or approximately constant, across the lower frequency range indicated in FIG. 10. In some such examples, the level of the noise-compensated output signal 403 may be shaped to emphasize the dialog portions of the noise-compensated output signal 403 relative to the level of the noise-compensated output signal 403 in other parts of the lower frequency range.

According to some implementations, the second method involves preserving the timbre of reproduced audio in the upper frequency range. According to the implementation corresponding to FIG. 10, the second method involves constraining all gains applied in frequency bands of the upper frequency range to be equal. In this example, the gain applied to the lowest frequency band of the upper frequency range is equal to, or within a predetermined range of, the gain applied to the highest frequency band of the lower frequency range.

In some examples, the gain that is applied in the upper frequency range is a weighted average of gains that would maintain the SNR across all frequency bands of the upper frequency range. The following is an example set of weights that could be applied to gains that would maintain the SNR in frequency bands of the upper frequency range: [1.0, 0.9, 0.8, 0.7, 0.6, 0.5, 0.4, 0.3, 0.2, 0.1]. According to some implementations, the set of weights may be included with input audio data, e.g., as metadata. In this example, the gain applied to the lowest frequency band of the upper frequency range is equal to the gain applied to the highest frequency band of the lower frequency range. Such examples may have several benefits. One benefit is preventing a discontinuity between the gains applied in the lower frequency range and the gains applied in the upper frequency range. Another benefit is that such a method emphasizes the areas of the spectrum to which human hearing is most sensitive. In some alternative examples, the weighting for gains corresponding to frequency bands of the upper frequency range may be the inverse of the equal loudness curves, so that the frequencies to which human hearing is most sensitive are weighted more than other frequency bands.

To ensure that listening to music is a low-fatigue experience, music is generally low-pass filtered at mixing time. By using a fixed gain at a wide range of frequencies the intention of this low pass filtering and overall timbre of the music can be maintained. Another benefit is that the gaussian noise of the microphones used in music recordings is not overemphasized, especially in the high frequencies, relative to sections of more important content. Accordingly, musical enjoyment may be maintained.

However, in some alternative examples the second method may involve constraining a difference between a first gain applied in a first frequency band of the upper frequency range and a second gain applied in a second frequency band of the upper frequency range to be less than or equal to a threshold amount. In some such examples the first frequency band may be adjacent to the second frequency band.

Figure 11:
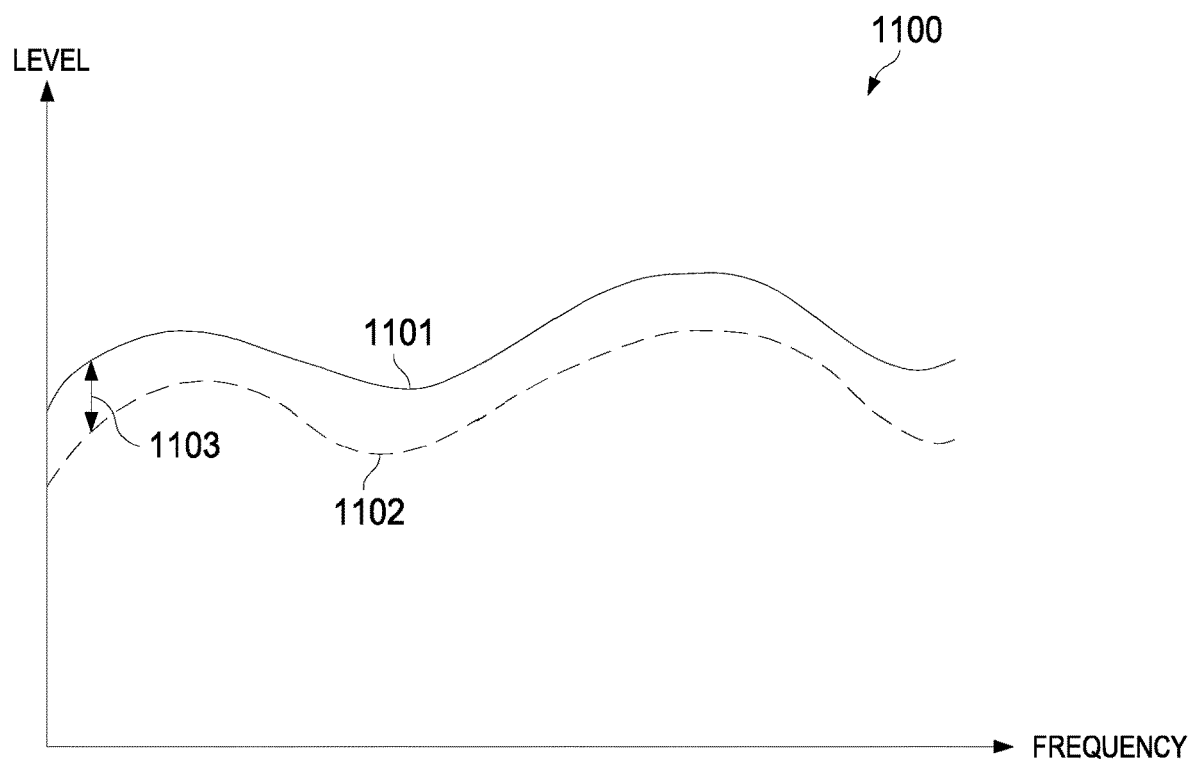
FIG. 11 shows an example of a graph corresponding to another noise compensation method.

FIG. 11 shows an example of a graph corresponding to another noise compensation method. The noise compensation method represented by the graph shown in FIG. 11 may be referred to herein as a "background music" noise compensation method. In some such examples, determining the noise compensation method may not be based on input content type.

In this example, the vertical axis of the graph 1100 indicates level and the horizontal axis indicates frequency. In some examples, the horizontal axis may indicate frequencies in a range audible to a typical human being, e.g., in the range of 20-20,000 Hz. In the graph 1100, the curve 1101 corresponds to the spectra of detected background noise. For example, the curve 1101 may correspond to a spectral estimate of the noise in the noise estimate 408 that the noise estimator 407 provides to the noise compensator 402. In this example, a control system is configured to implement an environmental noise classifier, such as the classifier 602 that is described above with reference to FIG. 6. According to this example, the classifier has determined that the environmental noise corresponds to one or more conversations. The context may, for example, be a party, a family gathering, etc.

According to this implementation, the curve 1102 represents the gains that are applied by the noise compensator 402 to reproduced corresponding to a noise compensation method. According to this example, the curve 1102 represents the gains that are applied to audio data of an input content stream by the noise compensator 402 to produce the noise-compensated output signals 403. In this example, the noise compensation method may be applied when a control system determines that the input content is a music content type and when a classifier determines that the environmental noise corresponds to one or more conversations. In some examples, the noise compensation method may be applied when a control system determines that the input content is a movie content type or a television program content type and when a classifier determines that the environmental noise corresponds to one or more conversations.

According to this example of a "background music" noise compensation method, the control system ensures that the level of reproduced audio, which may or may not be music, remains below the background noise level. In FIG. 11, the difference 1103 represents the difference between the curve 1101 and the curve 1102. Accordingly, the difference 1103 represents the difference between the background noise of an audio environment and the level of the noise-compensated output signal 403. In some examples, the gains that are applied by the noise compensator 402 ensure that the difference 1103 is constant, or approximately constant, across the frequency range indicated in FIG. 11. According to some such examples, if the ambient noise level of the audio environment decreases, than the playback level of the noise-compensated output signal 403 will be decreased by an amount necessary to keep the difference 1103 is constant, or approximately constant. In this context, "approximately" may mean within a predetermined range, e.g., within a 2% range, within a 5% range, within a 7% range, within a 10% range, within a 1 dB range, within a 2 dB range, within a 3 dB range, within a 4 dB range, etc.

In some such examples, the gains that are applied by the noise compensator 402 ensure that the signal-to-noise ratio (SNR) is constant, or approximately constant, across the frequency range indicated in FIG. 11. In some examples, the gains that are applied in one frequency band may be unconstrained with respect to the gains that are applied in another frequency band, e.g., relative to the gains that are applied in an adjacent frequency band.

Such methods may ensure that when the users of the system are talking the level of reproduced audio remains below their talking level. Accordingly, such methods can ensure that the people in the audio environment have a reasonable chance of hearing each other and of carrying on a conversation. In some examples, a "background music" noise compensation method may be initiated based on one or more other factors, such as user input, time of day, type of content and/or location. For example, in a kitchen or dining area of a home in which multiple people live, a "background music" noise compensation method may be desirable in many situations in order to enable conversations while food is being prepared, during mealtime conversations, etc. In some examples, a "background music" noise compensation method may be implemented by a "whole home" audio in which multiple loudspeakers in different rooms are configured to play the same content. According to some such examples, at least some (and in some instances all) loudspeakers of the audio environment may be a smart speakers that are independently configured for implementing the "background music" noise compensation method. In some alternative examples, at least some (and in some instances all) loudspeakers of the audio environment may be controlled by a central home control system, such as a smart home hub, that is configured for implementing the "background music" noise compensation method.

Figure 12:
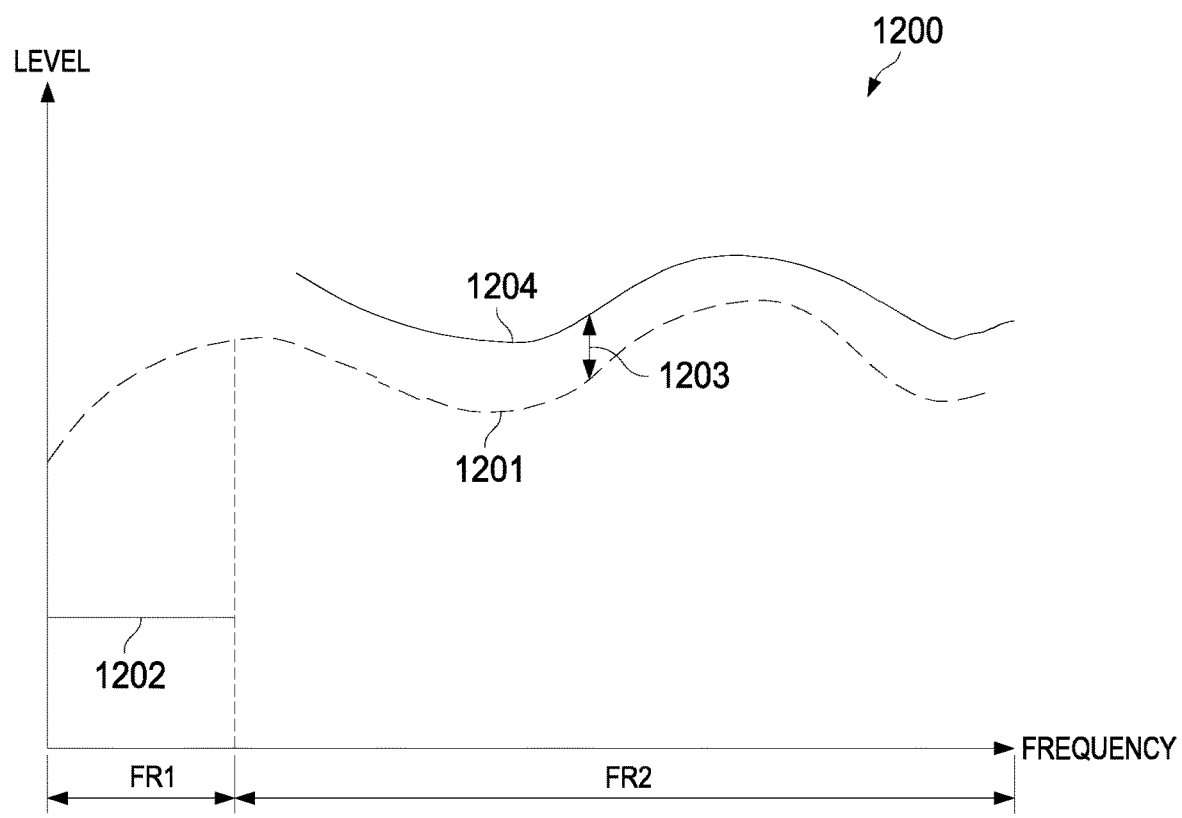
FIG. 12 shows an example of a graph corresponding to another noise compensation method.

FIG. 12 shows an example of a graph corresponding to another noise compensation method. The noise compensation method represented by the graph shown in FIG. 12 may be referred to herein as a "nighttime noise compensation method." However, such noise compensation methods also may be appropriate for times other than nighttime, such as a naptime, a study time, a teleconference time or other times during which it may be desirable to avoid disturbing others with unwanted reproduced audio, particularly audio reproduced in the bass range. In some such examples, determining the noise compensation method may not be based on input content type.

As in the previous examples, the vertical axis of the graph 1200 indicates level and the horizontal axis indicates frequency, which in this instance are frequencies in a range audible to a typical human being. In the graph 1200, the curve 1201 corresponds to the spectra of detected background noise. For example, the curve 1201 may correspond to a spectral estimate of the noise in the noise estimate 408 that the noise estimator 407 provides to the noise compensator 402.

According to this implementation, the curves 1202 and 1204 represent the gains that are applied by the noise compensator 402 to reproduced corresponding to a nighttime noise compensation method. In some implementations, the curves 1202 and 1204 may be connected, e.g., smoothly connected. According to this example, the curves 1202 and 1204 represent the gains that are applied to audio data of an input content stream by the noise compensator 402 to produce the noise-compensated output signals 403. In this example, the nighttime noise compensation method may be applied when a control system determines that the time of day is nighttime, e.g., after a predetermined time of the evening which may be configurable according to user input. However, in some examples a user may choose to provide user input indicating that the nighttime noise compensation method should be invoked, regardless of the time of day.

In this example, the noise compensation method involves a first method corresponding to a lower frequency range (frequency range one, labeled "FR1" in FIG. 12) and a second method corresponding to a higher frequency range (frequency range two, labeled "FR2" in FIG. 12). In this example, the lower frequency range corresponds to a "bass" frequency range, which may in some examples be between 20 and 250 Hz. In other examples, the lower frequency range may be a different range, e.g., between 20 and 300 Hz., between 20 and 350 Hz., between 20 and 400 Hz., between 20 and 450 Hz., between 20 and 500 Hz., etc. In some examples, the upper frequency range may be the entire audible range above the lower frequency range. However, in some other examples the upper frequency range may be less than the entire audible range above the lower frequency range.

In this implementation, the first method involves controlling the gain applied to audio data in the lower frequency range to be maintained at a constant level. In this example, the first method involves controlling the gain applied to audio data in the lower frequency range to be maintained at lower level than the lowest playback level of any higher-frequency audio data. According to this implementation, the first method involves controlling the gain applied to audio data in the lower frequency range to be lower than the ambient noise levels in the lower frequency range.

In FIG. 12, the difference 1203 represents the difference between the curve 1201 and the curve 1204. Accordingly, the difference 1203 represents the difference between the background noise of an audio environment and the level of the noise-compensated output signal 403 in one example of the first method. In some examples, the gains that are applied by the noise compensator 402 ensure that the difference 1203 is constant, or approximately constant, across the higher frequency range. According to some such examples, if the ambient noise level of the audio environment increases, the playback level of the noise-compensated output signal 403 will increased by an amount necessary to keep the difference 1203 constant, or approximately constant. In this context, "approximately" may mean within a predetermined range, e.g., within a 2% range, within a 5% range, within a 7% range, within a 10% range, within a 1 dB range, within a 2 dB range, within a 3 dB range, within a 4 dB range, etc. In some examples of the first method, the gains that are applied by the noise compensator 402 ensure that the signal-to-noise ratio (SNR) is constant, or approximately constant, across the higher frequency range indicated in FIG. 12.

However, according to some implementations, the difference 1203 and/or the SNR may not be constant, or approximately constant, across the higher frequency range indicated in FIG. 12. In some such examples, the level of the noise-compensated output signal 403 may be shaped to emphasize the dialog portions of the noise-compensated output signal 403 relative to the level of the noise-compensated output signal 403 in other parts of the higher frequency range. In some nighttime noise compensation implementations, a timbre-preserving noise compensation mode may be used for at least some frequency bands, e.g., for frequency range FR2. In some such examples, the curve 1204 may have the characteristics of the curve 1004 of FIG. 10.

Figure 13:
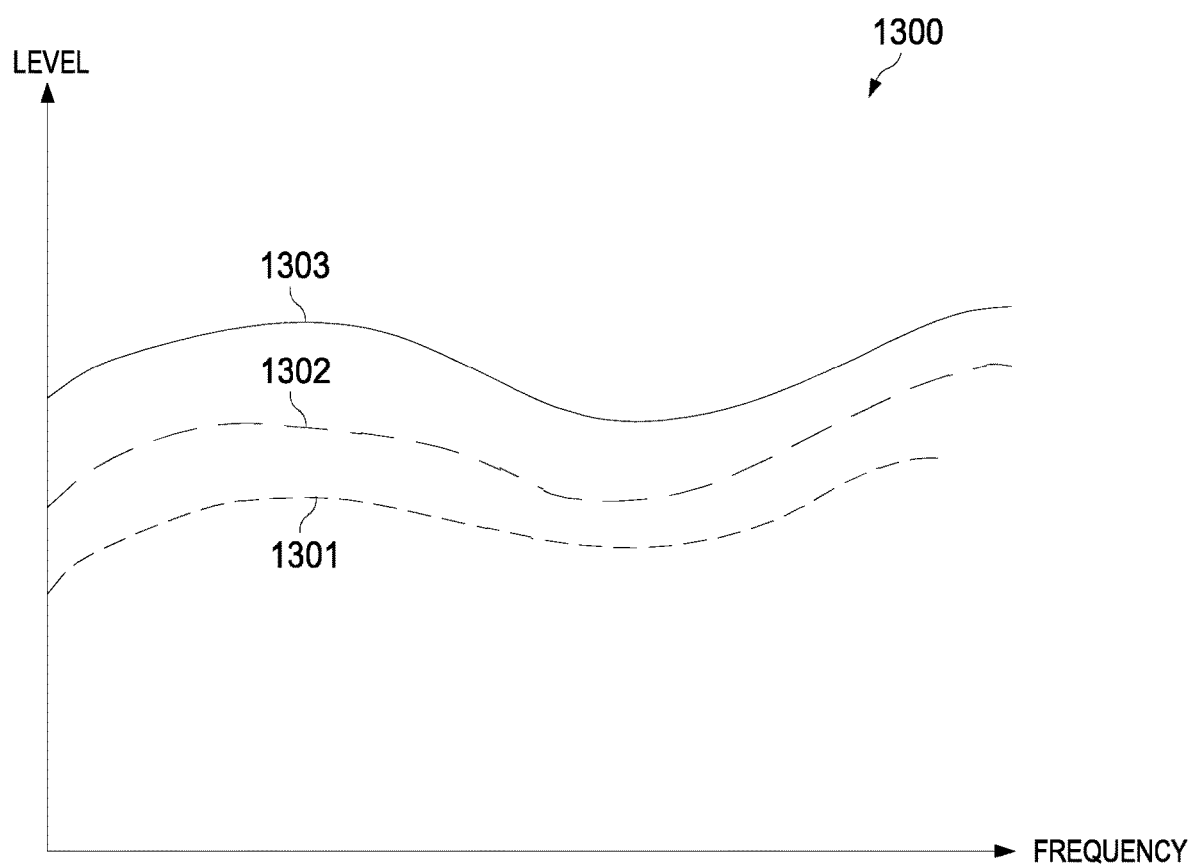
FIG. 13 shows an example of a graph corresponding to another noise compensation method.

FIG. 13 shows an example of a graph corresponding to another noise compensation method. As in the previous examples, the vertical axis of the graph 1300 indicates level and the horizontal axis indicates frequency, which in this instance are frequencies in a range audible to a typical human being. In the graph 1300, the curve 1301 corresponds to the spectra of detected background noise. In this example, the curve 1302 corresponds to a "normal" or "regular" noise compensation method. The curve 1302 may, for example, correspond to a noise compensation method that is appropriate for a movie content type or a television program content type during everyday use, e.g., in a person's home.

The noise compensation method represented by the curve 1303 may be referred to herein as a "demonstration noise compensation method," because such a noise compensation method may be appropriate during a demonstration of an audio device's and/or an audio system's capabilities, e.g., during a time that a potential buyer is evaluating the audio device and/or system. The demonstration noise compensation method is designed to over-emphasize the amount of noise compensation to ensure that even a non-audiophile listener can hear the effect of the noise compensation. However, such noise compensation methods also may be appropriate for other circumstances. Some listeners may prefer the demonstration noise compensation method over the "normal" or "regular" noise compensation method for everyday use.

Some disclosed implementations may involve the operation of what will be referred to herein as an "encoder." Although an encoder may be illustrated by a single block, an encoder may be implemented via one or more devices. In some implementations, an encoder may be implemented by one or more devices of a cloud-based service, such as one or more servers, data storage devices, etc., of a data center. In some examples, the encoder may be configured to determine a compensation process to be performed in response to a noise metric. Some such implementations may involve interactions between an encoder and a downstream "decoder," e.g., wherein the decoder provides an environmental noise metric to the encoder. Implementations in which the encoder performs at least some of the disclosed methods (e.g., determining the compensation process, or determining a plurality of selectable compensation processes) may be potentially advantageous because the encoder will generally have substantially more processing capabilities than the decoder.

Figure 14:
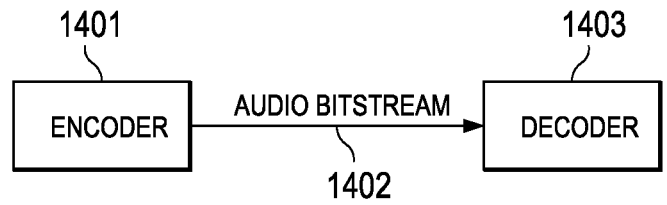
FIG. 14 shows examples of encoder and decoder blocks according to one implementation.

FIG. 14 shows examples of encoder and decoder blocks according to one implementation. In this example, an encoder 1401 is shown transmitting an encoded audio bitstream 1402 to a decoder 1403. In some such examples, the encoder 1401 may be configured for transmitting encoded audio bitstreams to a plurality of decoders.

According to some implementations, the encoder 1401 and the decoder 1403 may be implemented by separate instances of the control system 210, whereas in other examples the encoder 1401 and the decoder 1403 may be considered as portions of a single instance of the control system 210, e.g., as components of a single system. Although the encoder 1401 and the decoder 1403 are shown as single blocks in FIG. 14, in some implementations the encoder 1401 and/or the decoder 1403 may include more than one component, such as modules and/or sub-modules that are configured to perform various tasks.

In some implementations, the decoder 1403 may be implemented via one or more devices of an audio environment, such as a home audio environment. Some tasks that the decoder 1403 may perform are described above. In some such examples, the decoder 1403 may be implemented via a television of an audio environment, via a television control module of an audio environment, in multiple loudspeakers of a "whole home" audio system, etc. However, in some examples at least some of the functionality of the decoder 1403 may be implemented via one or more other devices of an audio environment, such as by a hearing aid, a personal sound amplification product, a cochlear implant, a headset, a laptop, a mobile device, a smart speaker, a smart home hub that is configured for communication with the decoder 1403 (e.g., via the Internet) and a television of the audio environment, etc.

In some implementations, the encoder 1401 may be implemented via one or more devices of a cloud-based service, such as one or more servers, data storage devices, etc., of a data center. In the example shown in FIG. 14, the encoder 1401 has received or obtained an audio bitstream, has encoded the received audio bitstream and is in the process of transmitting the encoded audio bitstream 1402 to the decoder 1403. In some such examples, the encoded audio bitstream 1402 may be part of an encoded content stream that includes encoded video data, e.g., corresponding to a television program, a movie, a musical performance, etc. The encoded audio bitstream 1402 may correspond to the encoded video data. For example, the encoded audio bitstream 1402 may include speech (e.g., dialogue) corresponding to the encoded video data. In some implementations, the encoded audio bitstream 1402 may include music and audio effects (M&E) corresponding to the encoded video data.

Figure 15:
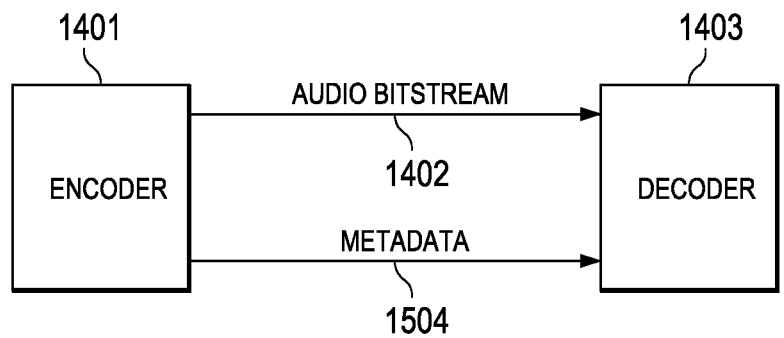
FIG. 15 shows examples of encoder and decoder blocks according to another implementation.

FIG. 15 shows examples of encoder and decoder blocks according to another implementation. In this example, an encoder 1401 is shown transmitting an encoded audio bitstream 1402 and one or more types of metadata 1504 to a decoder 1403.

In some such examples, the encoder 1401 may be configured for providing content metadata indicating a content type corresponding to at least a portion of the encoded audio bitstream 1402. For example, the metadata 1504 may include content metadata that indicates whether at least a portion of the encoded audio bitstream 1402 corresponds to a type of music. Alternatively, or additionally, the metadata 1504 may include content metadata that indicates whether at least a portion of the encoded audio bitstream 1402 corresponds to audio for to a movie or a television program. In some implementations, the content metadata may indicate whether at least a portion of the audio for to a movie or a television program in the encoded audio bitstream 1402 is a music-dominant portion and/or a musical interlude, in which the music is not merely background music but is intended to be heard clearly. In some such examples, the content metadata may indicate, e.g., that a portion of content is X % movie content and Y % musical content.

According to some such implementations, the decoder 1403 (or a control system that is configured for implementing the decoder 1403) may be configured for determining the content type of at least a portion of the encoded audio bitstream 1402 based, at least in part, on content metadata of the metadata 1504. For example, the process of determining the content type in block 310 of FIG. 3 may be based, at least in part, on the content metadata. In some such implementations, the decoder 1403 (or a control system that is configured for implementing the decoder 1403) may be configured for determining a noise compensation method that is based, at least in part, on the content type, e.g., as described above with reference to block 315 of FIG. 3. If the content metadata indicates, e.g., that a portion of content is X % movie content and Y % musical content, in some examples the decoder 1403 (or a control system that is configured for implementing the decoder 1403) may be configured to implement a hybrid noise compensation method that applies X % of the gains that would be applied according to a movie noise compensation method and Y % of the gains that would be applied according to a music noise compensation method. In some such examples, the decoder 1403 (or a control system that is configured for implementing the decoder 1403) may be configured for performing the remaining blocks of the method 300.

According to some examples, the metadata 1504 may indicate which noise compensation mode is allowed, e.g., for some or all of the audio bitstream 1402. Alternatively, or additionally, the metadata 1504 may indicate the amount of post processing that can be performed on the audio bitstream 1402. Alternatively, or additionally, the metadata 1504 may indicate the maximum amount of gains in a subsequent equalization process for the audio bitstream 1402.

Alternatively, or additionally, the metadata 1504 may include a timbre preservation indicator that indicates the degree to which the timbre of the audio bitstream 1402 should be preserved. In some such examples, a noise compensation system of the decoder 1403 may be configured to operate in a "music" mode when the timbre preservation indicator is a high value (e.g., greater than or equal to a threshold value) and may be configured to operate in a "movie" mode when the timbre preservation indicator is a low value (e.g., below a threshold value).

According to some examples, the metadata 1504 may include metadata corresponding to a dynamic range of at least a portion of the audio data and/or the amount of compression that has been applied to at least a portion of the audio data. In some such examples, the metadata may be dialnorm metadata of Dolby Digital, Dolby Digital Plus or AC-4. In some instances, the metadata may be reference level metadata of the High-Efficiency Advanced Audio Coding audio coding format. In some examples, the metadata may include dynamic range control metadata and/or loudness metadata according to MPEG-D Part 4: Dynamic Range Control (ISO/IEC 23003-4:2015). In some such implementations, the decoder 1403 (or a control system that is configured for implementing the decoder 1403) may be configured for determining a noise compensation method that is based, at least in part, on the metadata corresponding to the dynamic range, the loudness and/or the amount of compression that has been applied. According to some such examples, for audio that has at least a threshold amount of compression applied to it, in some examples a "music" noise compensation method may be applied, whereas for audio that has less than the threshold amount of compression applied to it, in some examples a "movie" or "television program" noise compensation method may be applied.

Alternatively, or additionally, the decoder 1403 (or a control system that is configured for implementing the decoder 1403) may be configured for controlling a noise estimation process based, at least in part, on metadata corresponding to the amount of compression that has been applied. In some such examples, for audio that has at least a threshold amount of compression applied to it, in some examples a relatively lower band count noise estimator may be applied. According to some such examples, for audio that has less than the threshold amount of compression applied to it, in some examples a default multiband noise estimator may be used.

In some implementations, the encoder 1401 may be configured to determine a noise compensation process for one or more content types. In some examples, the encoder 1401 may be configured to determine a noise compensation process for each of a plurality of content types. The plurality of content types may, for example, include at least one music content type, a movie content type and/or a television program content type. According to some such examples, the encoder 1401 may be configured for determining noise compensation metadata corresponding to each of the plurality of noise compensation process and for providing noise compensation metadata to the decoder 1403 that corresponds with a type of content that is currently being provided to the decoder 1403.

In some implementations, the encoder 1401 may be configured to determine a noise compensation process for one or more types of ambient noise profiles. Each of the ambient noise profiles may, in some examples, correspond to a category of ambient noise, such as traffic noise, train noise, rain, etc. In some such examples, the encoder 1401 may be configured for determining a plurality of noise compensation processes for each category of ambient noise. Each noise compensation process of the plurality of noise compensation processes may, for example, correspond to a different level of ambient noise. For example, one noise compensation process may correspond to a low level of ambient noise, another noise compensation process may correspond to a medium level of ambient noise and another noise compensation process may correspond to a high level of ambient noise.

According to some such examples, the encoder 1401 may be configured for determining noise compensation metadata corresponding to the noise compensation process and for providing the noise compensation metadata to the decoder 1403. In some such implementations, the encoder 1401 may be configured for determining noise compensation metadata corresponding to each noise compensation process of a plurality of noise compensation processes. In some such examples, the decoder 1403 (or another downstream device) may be configured to determine a category and/or a level of ambient noise in an audio environment and to select a corresponding noise compensation process according to noise compensation metadata received from the encoder 1401. Alternatively, or additionally, the decoder 1403 may be configured to determine an audio environment location and to select a corresponding noise compensation process according to noise compensation metadata received from the encoder 1401.

Figure 16:
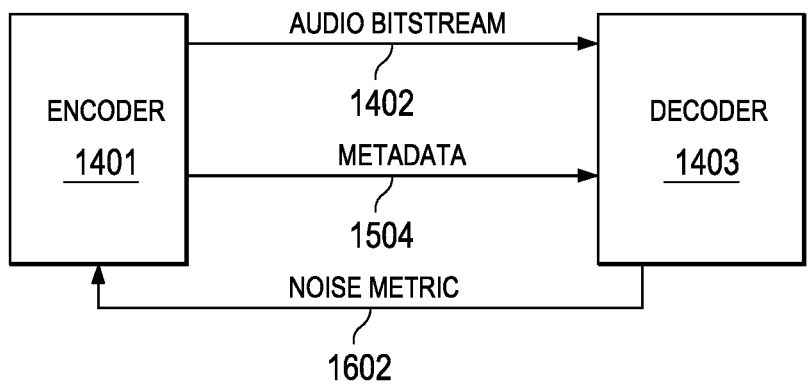
FIG. 16 shows examples of encoder and decoder blocks according to another implementation.

FIG. 16 shows examples of encoder and decoder blocks according to another implementation. In this example, an encoder 1401 is shown transmitting an encoded audio bitstream 1402 and one or more types of metadata 1504 to a decoder 1403. According to this examples, encoder 1401 is receiving a noise metric 1602 from the decoder 1403. In this example, the noise metric 1602 indicates a level of environmental noise in the audio environment in which the decoder 1403 resides. In some implementations, the noise metric 1602 may indicate a type of environmental noise in the audio environment, e.g., whether the environmental noise corresponds to a conversation in the audio environment. The noise metric 1602 may have been determined by the decoder 1403, by a control system that is configured for implementing the decoder 1403 (e.g., by a control system that is implementing a classifier, such as the classifier 602 of FIG. 6) or by another device in the same audio environment as the decoder 1403. In some examples, the encoder 1401 may be configured for determining a noise metric, e.g., according to environmental noise information (e.g., raw or processed microphone signals) provided by the decoder 1403, by a control system that is configured for implementing the decoder 1403 or by another device in the same audio environment as the decoder 1403.

In this example, the encoder 1401 is configured for determining a noise compensation process to be performed in response to the noise metric 1602, e.g., as disclosed elsewhere herein. The noise compensation process may, for example, correspond to a type of content that is being provided via the audio bitstream 1402. According to this example, the metadata 1504 includes compensation metadata corresponding to the noise compensation process. In this implementation, the decoder 1403, a control system that is implementing the decoder 1403 or another device in the audio environment in which the decoder 1403 resides is configured for determining a noise compensation process that corresponds with the compensation metadata and for applying the noise compensation process to the decoded audio bitstream 1402.

Figure 17:
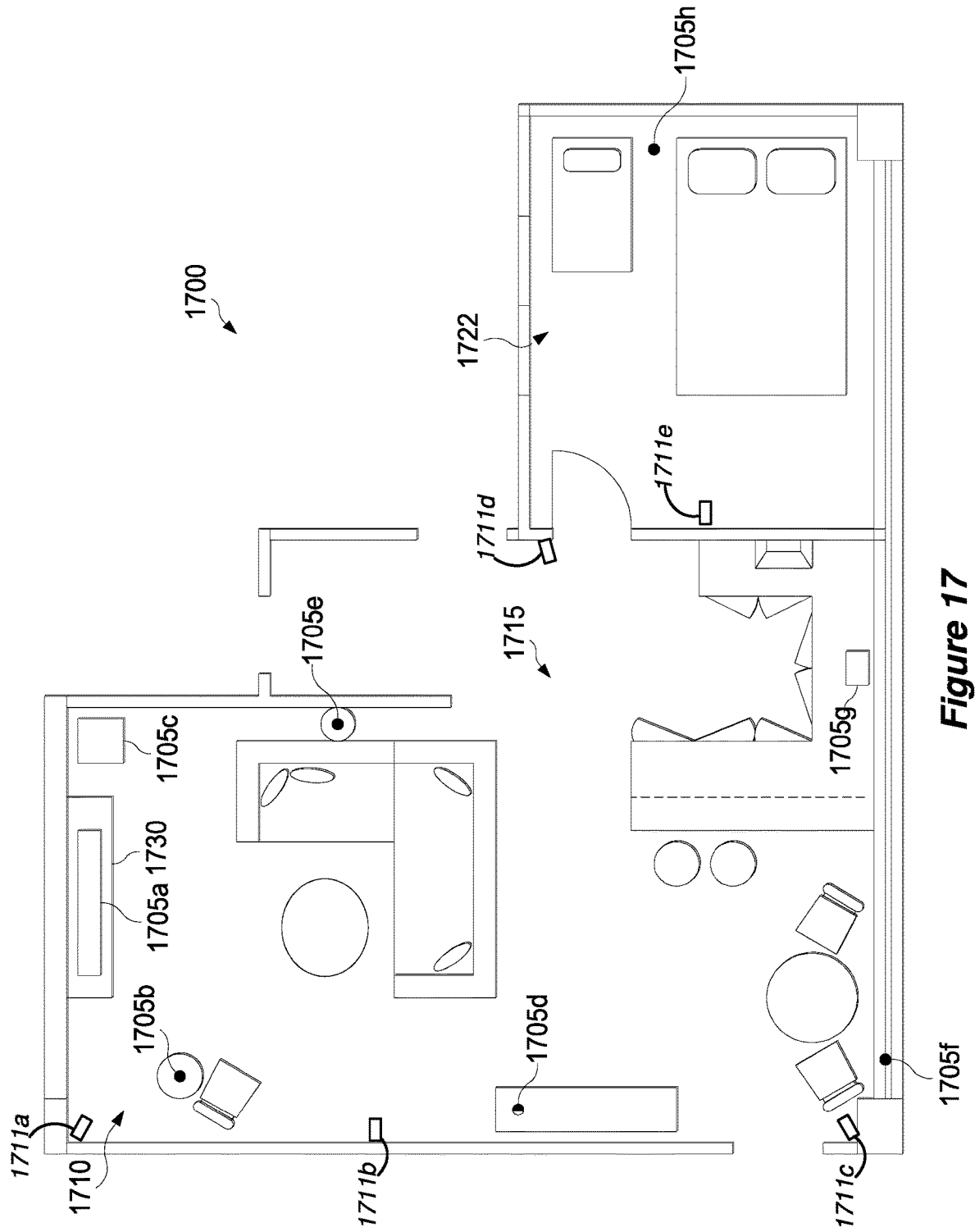
FIG. 17 shows an example of a floor plan of an audio environment, which is a living space in this example.

FIG. 17 shows an example of a floor plan of an audio environment, which is a living space in this example. As with other figures provided herein, the types and numbers of elements shown in FIG. 17 are merely provided by way of example. Other implementations may include more, fewer and/or different types and numbers of elements.

According to this example, the environment 1700 includes a living room 1710 at the upper left, a kitchen 1715 at the lower center, and a bedroom 1722 at the lower right. Boxes and circles distributed across the living space represent a set of loudspeakers 1705*a*-1705*h*, at least some of which may be smart speakers in some implementations, placed in locations convenient to the space, but not adhering to any standard prescribed layout (arbitrarily placed). In some examples, the television 1730 may be configured to implement one or more disclosed embodiments, at least in part. In this example, the environment 1700 includes cameras 1711*a*-1711*e*, which are distributed throughout the environment. In some implementations, one or more smart audio devices in the environment 1700 also may include one or more cameras. The one or more smart audio devices may be single purpose audio devices or virtual assistants. In some such examples, one or more cameras of the optional sensor system 130 may reside in or on the television 1730, in a mobile phone or in a smart speaker, such as one or more of the loudspeakers 1705*b*, 1705*d*, 1705*e* or 1705*h*. Although cameras 1711*a*-1711*e* are not shown in every depiction of the environment 1700 presented in this disclosure, each of the environments 1700 may nonetheless include one or more cameras in some implementations.

FIGS. 18-23 show examples in which a noise compensation module is configured to base a noise compensation process, at least in part, on data from one or more previous or "upstream" audio processes. In some instances, the one or more upstream audio processes may occur in an encoder. However, in some examples the one or more upstream audio processes may have previously occurred on the decoder side, e.g., after decoding but prior to audio processing by noise compensation module. Accordingly, FIGS. 18-23 show additional examples in which a noise compensation module may be configured to determine a noise compensation process based, at least in part, on factors other than an input content type. The blocks of FIGS. 18-23 may, for example, be implemented by a control system, such as the control system 210 of FIG. 2.

Figure 18:
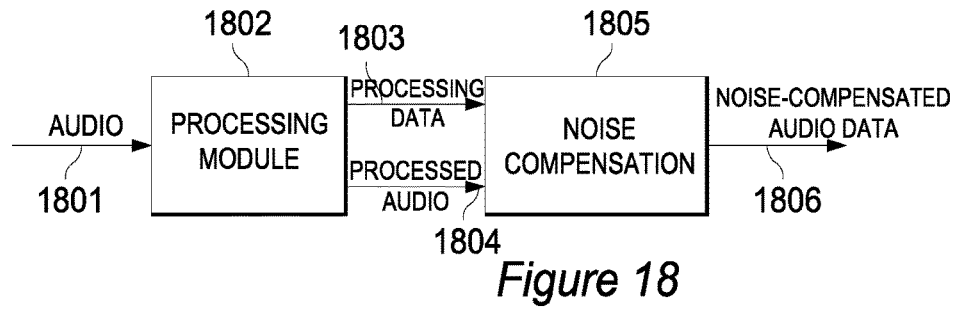
FIG. 18 shows an example in which a noise compensation module is configured to base a noise compensation process, at least in part, on data from an upstream linear processing module.

FIG. 18 shows an example in which a noise compensation module is configured to base a noise compensation process, at least in part, on data from an upstream linear processing module. In some examples, the processing module 1802 and the noise compensation module 1805 may be implemented by an instance of the control system 210.

According to this example, the audio data 1801 is input to the processing module 1802. In some examples, the audio data 1804 has been processed by the processing module 1802. In some examples, the processing module 1802 may be configured to perform a type of linear or non-linear processing which, if the noise compensation method implemented by the noise compensation module 1805 were unconstrained, would impair or even destroy the audio enhancement caused by of the processing module 1802.

In this example, the processing module 1802 also provides processing data 1803 to the noise compensation module 1805. In some examples, the processing data 1803 may indicate whether the audio data 1804 was processed by the processing module 1802. According to some examples, the processing data 1803 may indicate the degree of processing, e.g., the degree or extent of an equalization process, that was applied by the processing module 1802.

In this example, the noise compensation module 1805 is configured to select and/or modify a noise compensation method based, at least in part, on the processing data 1803. In some examples, the noise compensation module 1805 may be configured to select a timbre-preserving noise compensation mode, such as the "music" noise compensation mode described herein, if the processing data 1803 indicates that the audio data 1804 was processed by the processing module 1802. According to some examples, the noise compensation module 1805 may be configured to select an unconstrained noise compensation mode, such as the "movie" noise compensation mode described herein, if the processing data 1803 indicates that the audio data 1804 was not processed by the processing module 1802. In this example, the noise compensation module 1805 is configured to output the noise-compensated audio data 1806.

Figure 19:
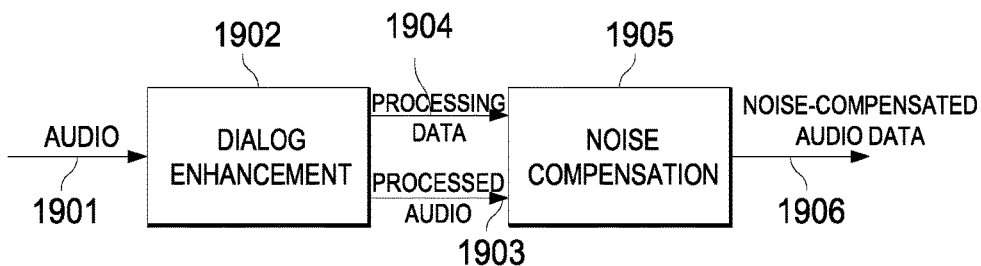
FIG. 19 shows an example in which a noise compensation module is configured to base a noise compensation process, at least in part, on whether an upstream dialog enhancement process has occurred.

FIG. 19 shows an example in which a noise compensation module is configured to base a noise compensation process, at least in part, on whether an upstream dialog enhancement process has occurred. In some examples, the dialog enhancement module 1902 and the noise compensation module 1905 may be implemented by an instance of the control system 210 that is implemented on the decoder side, e.g., as part of the decoder 1403 or after the operation of the decoder 1403 that is described above with reference to FIGS. 14-16. In some examples, the dialog enhancement module 1902 may be implemented by an instance of the control system 210 that is implemented on the encoder side, e.g., as part of the encoder 1401.

According to this example, the audio data 1901 is input to the dialog enhancement module 1902. In some examples, the audio data 1903 has been processed by the dialog enhancement module 1902. In this example, the dialog enhancement module 1902 also provides processing data 1904 to the noise compensation module 1905. In some examples, the processing data 1904 may indicate whether the audio data 1903 was processed by the dialog enhancement module 1902. According to some examples, the processing data 1904 may indicate the degree of processing, e.g., the degree or extent of a dialog enhancement process that was applied by the dialog enhancement module 1902.

In this example, the noise compensation module 1905 is configured to select and/or modify a noise compensation method based, at least in part, on the processing data 1904. In some examples, the noise compensation module 1905 may be configured to select a timbre-preserving or "music" noise compensation mode if the processing data 1904 indicates that the audio data 1903 was processed by the dialog enhancement module 1902. In some implementations, the noise compensation module 1905 may be configured to select a timbre-preserving or "music" noise compensation mode if the processing data 1904 indicates that at least a threshold amount of dialog enhancement was caused by the dialog enhancement module 1902. In some examples, the noise compensation module 1905 may be configured to only act on a subset of the audio 1903 (e.g., a dialog stream) to ensure that the audio subset is clearer if the dialog enhancement module 1902 is on. According to some examples, the noise compensation module 1905 may be configured to select an unconstrained or "movie" noise compensation mode if the processing data 1904 indicates that the audio data 1903 was not processed by the dialog enhancement module 1902. In this example, the noise compensation module 1905 is configured to output the noise-compensated audio data 1906.

Figure 20:
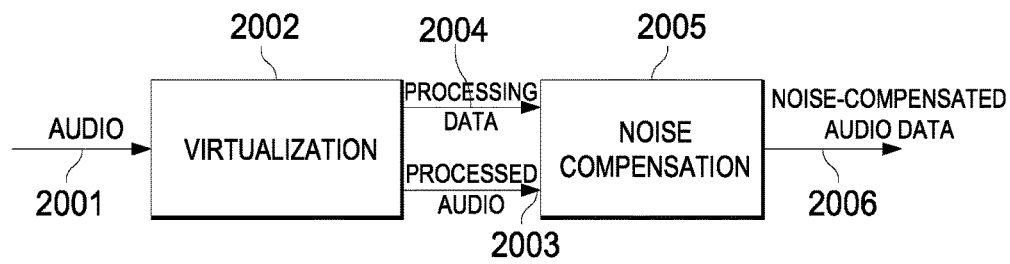
FIG. 20 shows an example in which a noise compensation module is configured to base a noise compensation process, at least in part, on whether an upstream virtualization process has occurred.

FIG. 20 shows an example in which a noise compensation module is configured to base a noise compensation process, at least in part, on whether an upstream virtualization process has occurred. According to some examples, the virtualization module 2002 may be configured to provide height virtualization, e.g., to process the audio data 2001 such that, when played back by loudspeakers of an audio system that does not include ceiling loudspeakers, some of the reproduced audio appears to emanate from ceiling loudspeakers. Alternatively, or additionally, in some examples the virtualization module 2002 may be configured to provide other types of loudspeaker virtualization, e.g., to process the audio data 2001 such that, when played back by physical loudspeakers of an audio system, some of the reproduced audio appears to emanate from additional, virtual loudspeakers that are not actual, physical loudspeakers.

In some examples, the virtualization module 2002 and the noise compensation module 2005 may be implemented by an instance of the control system 210 that is implemented on the decoder side, e.g., as part of the decoder 1403 or after the operation of the decoder 1403 that is described above with reference to FIGS. 14-16. In some examples, the virtualization module 2002 may be implemented by an instance of the control system 210 that is implemented on the encoder side, e.g., as part of the encoder 1401.

According to this example, the audio data 2001 is input to the virtualization module 2002. In some examples, the audio data 2003 has been processed by the virtualization module 2002. In this example, the virtualization module 2002 also provides processing data 2004 to the noise compensation module 2005. In some examples, the processing data 2004 may indicate whether the audio data 2003 was processed by the virtualization module 2002. According to some examples, the processing data 2004 may indicate the degree of processing, e.g., the degree or extent of a virtualization process that was applied by the virtualization module 2002.

In this example, the noise compensation module 2005 is configured to select and/or modify a noise compensation method based, at least in part, on the processing data 2004. In some examples, the noise compensation module 2005 may be configured to select a timbre-preserving or "music" noise compensation mode if the processing data 2004 indicates that the audio data 2003 was processed by the virtualization module 2002. In some implementations, the noise compensation module 2005 may be configured to select a timbre-preserving or "music" noise compensation mode if the processing data 2004 indicates that at least a threshold amount of virtualization was caused by the virtualization module 2002. According to some examples, the noise compensation module 2005 may be configured to select an unconstrained or "movie" noise compensation mode if the processing data 2004 indicates that the audio data 2003 was not processed by the virtualization module 2002. In this example, the noise compensation module 2005 is configured to output the noise-compensated audio data 2006.

Figure 21:
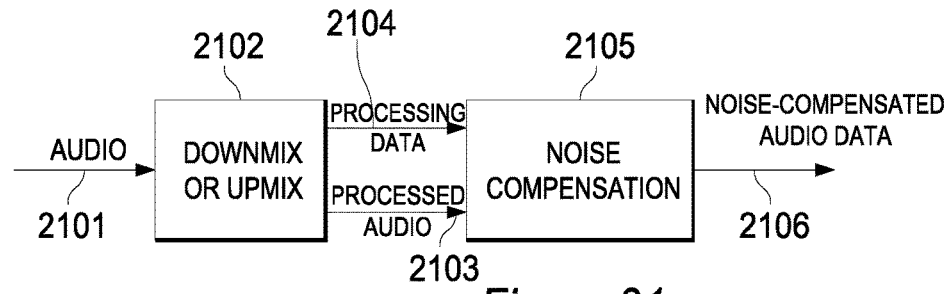
FIG. 21 shows an example in which a noise compensation module is configured to base a noise compensation process, at least in part, on whether an upstream downmix or upmix process has occurred.

FIG. 21 shows an example in which a noise compensation module is configured to base a noise compensation process, at least in part, on whether an upstream downmix or upmix process has occurred. In some examples, the downmix or upmix module 2102 and the noise compensation module 2105 may be implemented by an instance of the control system 210.

According to this example, the audio data 2101 is input to the downmix or upmix module 2102. In this example, the audio data 2103 has been processed by the downmix or upmix module 2102. In this example, the downmix or upmix module 2102 also provides processing data 2104 to the noise compensation module 2105. In some examples, the processing data 2104 may indicate whether the audio data 2103 was downmixed or upmixed. According to some examples, the processing data 2104 may indicate the degree of processing, e.g., the degree or extent of a downmix or upmix process that was applied by the downmix or upmix module 2102. An active mixer (e.g. one that upmixes or downmixes by inspecting the content) may, for example, determine how correlated parts of the audio signal are in order to decide where to place components of the audio signal. For a static downmix or upmix the exact coefficients used and/or the type of processing that was performed may also be applicable to the noise compensation process.

In this example, the noise compensation module 2105 is configured to select and/or modify a noise compensation method based, at least in part, on the processing data 2104. In some examples, the noise compensation module 2105 may be configured to select a timbre-preserving or "music" noise compensation mode if the processing data 2104 indicates that the audio data 2103 was upmixed by the downmix or upmix module 2102. According to some examples, the noise compensation module 2105 may be configured to select a timbre-preserving or "music" noise compensation mode if the processing data 2104 indicates that the audio data 2103 was downmixed by the downmix or upmix module 2102.

In some examples, the downmix or upmix module 2102 may be configured to render audio data (e.g., audio data that includes audio objects and associated spatial metadata) to loudspeaker feed signals. According to some such examples, the object rendering process may, based at least on part, upon the number of audio objects and where they are rendered, involve adjusting the type of noise compensation. For example, if the balance of the mix is mainly in the surround loudspeakers (which is determined by the locations of the objects or by metadata that determines the front/back balance) object render involves virtualization, that audio data may be heavily virtualized. In some such implementations, the noise compensation module 2205 may be configured to select a timbre-preserving or "music" noise compensation mode based on the associated processing data 2104. For situations in which the balance of the mix is mainly in the front loudspeakers (or alternatively where the output loudspeakers are located) there may be relatively less virtualization. In some such implementations, the noise compensation module 2205 may be configured to select a non-timbre-preserving or "movie" noise compensation mode based on the associated processing data 2104. In this example, the noise compensation module 2105 is configured to output the noise-compensated audio data 2106.

Figure 22:
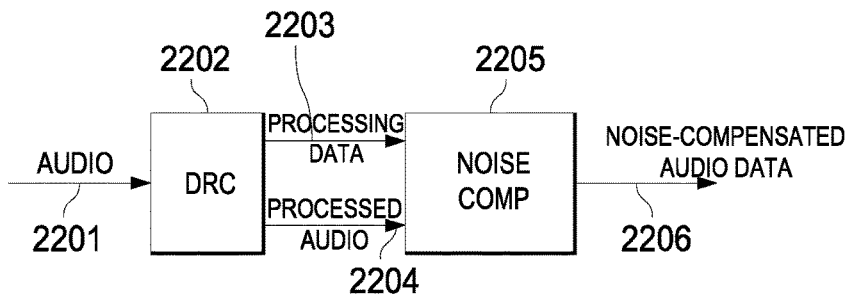
FIG. 22 shows an example in which a noise compensation module is configured to base a noise compensation process, at least in part, on whether an upstream dynamic range compression process has occurred.

FIG. 22 shows an example in which a noise compensation module is configured to base a noise compensation process, at least in part, on whether an upstream dynamic range compression process has occurred. In some examples, the dynamic range compression module 2202 and the noise compensation module 2205 may be implemented by an instance of the control system 210.

According to this example, the audio data 2201 is input to the dynamic range compression module 2202. In this example, the audio data 2204 has been processed by the dynamic range compression module 2202. In this example, the dynamic range compression module 2202 also provides processing data 2203 to the noise compensation module 2205. In some examples, the processing data 2203 may indicate whether the audio data 2204 was processed by the dynamic range compression module 2202. According to some examples, the processing data 2203 may indicate the degree of processing, e.g., the degree or extent of dynamic range compression that was applied by the dynamic range compression module 2202. In some such examples, the processing data 2203 may indicate the maximum, minimum or average compression that was applied by the dynamic range compression module 2202. In some such examples, the processing data 2203 may indicate a weighted average compression that was applied by the dynamic range compression module 2202. Alternatively, or additionally, the dynamic range compression module 2202 may provide an overall level to the noise compensation system (e.g., measured in the same way as described elsewhere herein with reference to the dialnorm metadata).

In this example, the noise compensation module 2205 is configured to select and/or modify a noise compensation method based, at least in part, on the processing data 2203. In some examples, the noise compensation module 2205 may be configured to select a timbre-preserving or "music" noise compensation mode if the processing data 2203 indicates that at least a threshold level of compression was applied by the dynamic range compression module 2202. According to some examples, the noise compensation module 2205 may be configured to select a timbre-preserving or "movie" noise compensation mode if the processing data 2203 indicates that less than the threshold level of compression was applied by the dynamic range compression module 2202. In this example, the noise compensation module 2205 is configured to output the noise-compensated audio data 2206.

Figure 23:
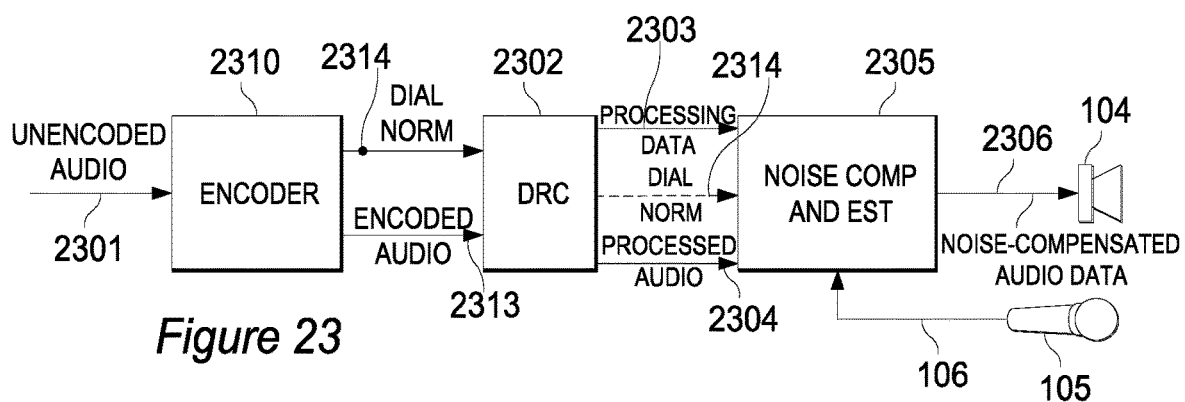
FIG. 23 shows another example in which a noise compensation module is configured to base a noise compensation process, at least in part, on whether an upstream dynamic range compression process has occurred.

FIG. 23 shows another example in which a noise compensation module is configured to base a noise compensation process, at least in part, on whether an upstream dynamic range compression process has occurred. According to some implementations, some concepts described above with reference to FIG. 22 may be further extended by utilizing a level estimator within an encoder. In the case of Dolby Digital Plus, the output of the level estimator is indicated by a "dialnorm" metadata value. In some instances, the dialnorm metadata may be set by other mechanisms, such as by a fixed value to indicate whether or not the audio data should be fully compressed.

FIG. 23 shows an example of a system that incorporates a dialnorm. In some examples, the dynamic range compression module 2302 and the noise compensation module 2305 may be implemented by an instance of the control system 210 on the decoder side, e.g., by an instance of the decoder 1403 that is described above with reference to FIGS. 14-16. In some examples, the encoder 2310 may be an instance of the encoder 1401 that is described above with reference to FIGS. 14-16.

In FIG. 23, unencoded audio 2301 is provided to the encoder 2310. In this example, the encoder 2310 is configured to implement a level measurement of the content (which includes the audio 2301 in this example) and to output a dialnorm metadata value 2314. In some such examples, the dialnorm metadata value 2314 allows different types of content to be appropriately leveled by downstream audio processing devices. In the United States, such level-controlling processes are required for broadcast systems by the Commercial Advertisement Loudness Mitigation (CALM) Act.

In systems that are not configured to comply with the CALM Act, the dialnorm metadata value 2314 may be set to a fixed value in some instances. If the dialnorm metadata value 2314 is set to a fixed value the noise compensation system may in some cases fall back to a timbre-preserving or "music" noise compensation mode, because the fixed dialnorm metadata value is generally set to achieve the maximum amount of compression. If the dialnorm metadata value 2314 is set to a fixed value that results in minimal compression, in some examples the noise compensation system may implement an unconstrained or "movie" noise compensation mode.

In FIG. 23, the audio 2313 that is to be levelled is provided to the dynamic range compression module 2302, which may be implemented via an instance of the decoder 1403 in some examples. In this example, the dialnorm metadata value 2314 is also provided to the dynamic range compression module 2302.

In this example, the audio data 2304 has been processed by the dynamic range compression module 2302. In this example, the dynamic range compression module 2302 also provides processing data 2303 to the noise compensation module 2305. In some examples, the processing data 2303 may indicate whether the audio data 2304 was processed by the dynamic range compression module 2302. According to some examples, the processing data 2303 may indicate the degree of processing, e.g., the degree or extent of dynamic range compression that was applied by the dynamic range compression module 2302. In some such examples, the processing data 2303 may indicate the maximum, minimum or average compression that was applied by the dynamic range compression module 2302. In some such examples, the processing data 2303 may indicate a weighted average compression that was applied by the dynamic range compression module 2302. In some such examples, the processing data 2303 may indicate an output target compression level.

In this example, the noise compensation module 2305 is configured to select and/or modify a noise compensation method based, at least in part, on the processing data 2303. In some examples, the noise compensation module 2305 may be configured to select a timbre-preserving or "music" noise compensation mode if the processing data 2303 indicates that any compression was applied by the dynamic range compression module 2302. In some examples, the noise compensation module 2305 may be configured to select a timbre-preserving or "music" noise compensation mode if the processing data 2303 indicates that at least a threshold level of compression was applied by the dynamic range compression module 2302. According to some examples, the noise compensation module 2305 may be configured to select an unconstrained or "movie" noise compensation mode if the processing data 2303 indicates that less than the threshold level of compression was applied by the dynamic range compression module 2302. In this example, the noise compensation module 2305 is configured to output the noise-compensated audio data 2306 to the loudspeaker 104.

In some examples, as shown in FIG. 23, the dialnorm metadata value 2314 may be provided to the noise compensation module 2305. If the dialnorm metadata value 2314 indicates that the content is of a high level (in other words, that the content has a small amount of "headroom" between a current level and a level limit that may applied), in some examples the noise compensation module 2305 may be configured to implement a timbre-preserving or "music" noise compensation mode. If the dialnorm metadata value 2314 indicates that the content is of a low level (in other words, that the content has a large amount of headroom), in some examples the noise compensation module 2305 may be configured to implement an unconstrained or "movie" noise compensation mode. If the dialnorm metadata value 2314 indicates that the content is of an intermediate level (in other words, that the content has an intermediate amount of headroom), in some examples the noise compensation module 2305 may be configured to implement a hybrid noise compensation mode, such as a partially timbre-preserving noise compensation mode. In some examples, the dialnorm metadata value 2314 may be set to a fixed value, which may indicate that the content has been authored by a particular tool (e.g. a DVD encoding tool). In some such examples, the noise compensation module 2305 may be configured to implement a noise compensation mode corresponding to the fixed value.

Some aspects of present disclosure include a system or device configured (e.g., programmed) to perform one or more examples of the disclosed methods, and a tangible computer readable medium (e.g., a disc) which stores code for implementing one or more examples of the disclosed methods or steps thereof. For example, some disclosed systems can be or include a programmable general purpose processor, digital signal processor, or microprocessor, programmed with software or firmware and/or otherwise configured to perform any of a variety of operations on data, including an embodiment of disclosed methods or steps thereof. Such a general purpose processor may be or include a computer system including an input device, a memory, and a processing subsystem that is programmed (and/or otherwise configured) to perform one or more examples of the disclosed methods (or steps thereof) in response to data asserted thereto.

Some embodiments may be implemented as a configurable (e.g., programmable) digital signal processor (DSP) that is configured (e.g., programmed and otherwise configured) to perform required processing on audio signal(s), including performance of one or more examples of the disclosed methods. Alternatively, embodiments of the disclosed systems (or elements thereof) may be implemented as a general purpose processor (e.g., a personal computer (PC) or other computer system or microprocessor, which may include an input device and a memory) which is programmed with software or firmware and/or otherwise configured to perform any of a variety of operations including one or more examples of the disclosed methods. Alternatively, elements of some embodiments of the inventive system are implemented as a general purpose processor or DSP configured (e.g., programmed) to perform one or more examples of the disclosed methods, and the system also includes other elements (e.g., one or more loudspeakers and/or one or more microphones). A general purpose processor configured to perform one or more examples of the disclosed methods may be coupled to an input device (e.g., a mouse and/or a keyboard), a memory, and a display device.

Another aspect of present disclosure is a computer readable medium (for example, a disc or other tangible storage medium) which stores code for performing (e.g., coder executable to perform) one or more examples of the disclosed methods or steps thereof.

While specific embodiments of the present disclosure and applications of the disclosure have been described herein, it will be apparent to those of ordinary skill in the art that many variations on the embodiments and applications described herein are possible without departing from the scope of the disclosure described and claimed herein. It should be understood that while certain forms of the disclosure have been shown and described, the disclosure is not to be limited to the specific embodiments described and shown or the specific methods described.

The invention claimed is:

1. A content stream processing method, comprising:
receiving, by a control system and via an interface system, a content stream that includes audio data;
determining, by the control system, a content type corresponding to the content stream;
determining, by the control system and based at least in part on the content type, a noise compensation method;
determining, by the control system, a noise estimate for an audio environment in which the content stream will be reproduced;
performing, by the control system and based at least in part on the noise estimate, the noise compensation method on the audio data to produce noise-compensated audio data;
rendering, by the control system, the noise-compensated audio data for reproduction via a set of audio reproduction transducers of the audio environment, to produce rendered audio signals; and
providing, via the interface system, the rendered audio signals to at least some audio reproduction transducers of the set of audio reproduction transducers of the audio environment.

2. The method of claim 1, wherein determining the noise compensation method involves selecting the noise compensation method from a plurality of noise compensation methods, each of the noise compensation methods corresponding to one or more content types of a plurality of content types.

3. The method of claim 2, wherein the plurality of content types includes at least one music content type.

4. The method of claim 3, wherein a noise compensation method corresponding to the at least one music content type involves a first method corresponding to a lower frequency range and a second method corresponding to an upper frequency range.

5. The method of claim 4, wherein the first method involves allowing a first gain applied to a first frequency band in the lower frequency range to be independent of a second gain applied to a second frequency band in the lower frequency range.

6. The method of claim 4, wherein the second method involves constraining all gains applied in frequency bands of the upper frequency range to be equal.

7. The method of claim 4, wherein the second method involves constraining a difference between a first gain and a second gain to be less than or equal to a threshold amount, wherein the first gain is applied in a first frequency band of the upper frequency range and the second gain is applied in a second frequency band of the upper frequency range, the first frequency band being adjacent to the second frequency band.

8. The method of claim 2, wherein the plurality of content types includes at least one of a movie content type or a television program content type.

9. The method of claim 1, wherein determining the content type is based, at least in part, on determining a content provider for the content stream.

10. The method of claim 1, wherein determining the content type is based, at least in part, on user input regarding the content stream.

11. The method of claim 10, wherein the user input is received via a voice command to a virtual assistant.

12. The method of claim 1, wherein the content stream includes content metadata and wherein determining the content type is based, at least in part, on the content metadata.

13. The method of claim 1, wherein the control system is configured to implement an audio classifier and wherein determining the content type is based, at least in part, on an audio classification produced by the audio classifier.

14. The method of claim 1, wherein determining the noise estimate involves at least one of receiving the noise estimate from a noise estimation module or calculating the noise estimate based on microphone signals of one or more microphones in the audio environment.

15. The method of claim 1, wherein determining the noise compensation method is based, at least in part, on a time of day.

16. The method of claim 15, wherein a nighttime noise compensation method involves controlling playback levels of at least some frequency bands of reproduced audio data to be lower than playback levels of corresponding frequency bands of reproduced audio data corresponding to a daytime noise compensation method.

17. The method of claim 16, wherein the at least some frequency bands correspond to bass frequency bands.

18. The method of claim 1, wherein determining the noise compensation method is based, at least in part, on a type of ambient noise in the audio environment.

19. The method of claim 18, wherein the type of ambient noise corresponds to conversation and wherein the noise compensation method involves controlling a playback level of reproduced audio data to be lower than an ambient noise level.

20. An apparatus configured for implementing the method of claim 1.

21. A system configured for implementing the method of claim 1.

22. One or more non-transitory media having software stored thereon, the software including instructions for controlling one or more devices to perform the method of claim 1.

* * * * *

UNITED STATES PATENT AND TRADEMARK OFFICE
CERTIFICATE OF CORRECTION

PATENT NO. : 11,817,114 B2
APPLICATION NO. : 17/779515
DATED : November 14, 2023
INVENTOR(S) : Timothy Alan Port et al.

It is certified that error appears in the above-identified patent and that said Letters Patent is hereby corrected as shown below:

On the Title Page

Column 1, (22) PCT Filed, Line 1, delete "Dec. 9, 2019" and insert --Dec. 9, 2020-- therefor Signed and Sealed this
Thirteenth Day of February, 2024

Katherine Kelly Vidal
*Director of the United States Patent and Trademark Office*